(12) United States Patent
Meinhold

(10) Patent No.: US 9,723,716 B2
(45) Date of Patent: Aug. 1, 2017

(54) CONTACT PAD STRUCTURE, AN ELECTRONIC COMPONENT, AND A METHOD FOR MANUFACTURING A CONTACT PAD STRUCTURE

(71) Applicant: Infineon Technologies AG, Neubiberg (DE)

(72) Inventor: Dirk Meinhold, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 211 days.

(21) Appl. No.: 14/038,864

(22) Filed: Sep. 27, 2013

(65) Prior Publication Data

US 2015/0092371 A1    Apr. 2, 2015

(51) Int. Cl.
*H05K 7/10* (2006.01)
*H05K 1/11* (2006.01)
(Continued)

(52) U.S. Cl.
CPC .............. *H05K 1/111* (2013.01); *H01L 24/05* (2013.01); *H05K 1/03* (2013.01); *H05K 1/09* (2013.01); *H05K 3/10* (2013.01); *H01L 23/3157* (2013.01); *H01L 24/03* (2013.01); *H01L 24/45* (2013.01); *H01L 24/48* (2013.01); *H01L 2224/03464* (2013.01); *H01L 2224/04042* (2013.01); *H01L 2224/05006* (2013.01); *H01L 2224/05007* (2013.01); *H01L 2224/05026* (2013.01); *H01L 2224/05027* (2013.01); *H01L 2224/05096* (2013.01); *H01L 2224/05124* (2013.01); *H01L 2224/05147* (2013.01); *H01L 2224/05155* (2013.01); *H01L 2224/05164* (2013.01); *H01L 2224/05166* (2013.01); *H01L 2224/05181* (2013.01); *H01L 2224/05547* (2013.01); *H01L 2224/05562* (2013.01); *H01L 2224/05567* (2013.01); *H01L 2224/05568* (2013.01);
(Continued)

(58) Field of Classification Search
CPC . H05K 1/03; H05K 1/09; H05K 1/111; H05K 3/10
USPC ......... 361/767, 764, 760; 174/257, 260, 261
See application file for complete search history.

(56) References Cited

U.S. PATENT DOCUMENTS 6,452,276 B1 * 9/2002 Cohen ............... H01L 21/76843
257/763
7,323,781 B2 * 1/2008 Noguchi et al. ............... 257/758
(Continued)

*Primary Examiner* — Yuriy Semenenko
(74) *Attorney, Agent, or Firm* — Viering, Jentschura & Partner MBB

(57) ABSTRACT

According to various embodiments, a contact pad structure may be provided, the contact pad structure may include: a dielectric layer structure; at least one contact pad being in physical contact with the dielectric layer structure; the at least one contact pad including a metal structure and a liner structure, wherein the liner structure is disposed between the metal structure of the at least one contact pad and the dielectric layer structure, and wherein a surface of the at least one contact pad is at least partially free from the liner structure, and a contact structure including an electrically conductive material; the contact structure completely covering at least the surface being at least partially free from the liner structure of the at least one contact pad, wherein the liner structure and the contact structure form a diffusion barrier for a material of the metal structure of the at least one contact pad.

26 Claims, 10 Drawing Sheets

(51) Int. Cl.
*H05K 1/03* (2006.01)
*H05K 1/09* (2006.01)
*H05K 3/10* (2006.01)
H01L 23/31 (2006.01)
H01L 23/00 (2006.01)

(52) U.S. Cl.
CPC ............... *H01L 2224/05571* (2013.01); *H01L 2224/05644* (2013.01); *H01L 2224/45144* (2013.01); *H01L 2224/48463* (2013.01); *H01L 2924/00014* (2013.01); *H01L 2924/13055* (2013.01); *H01L 2924/13091* (2013.01); *Y10T 29/49155* (2015.01)

(56) References Cited

U.S. PATENT DOCUMENTS

| | | | |
|---|---|---|---|
| 7,741,228 B2 * | 6/2010 | Ueki et al. | 438/736 |
| 2004/0266167 A1 * | 12/2004 | Dubin et al. | 438/619 |
| 2006/0030143 A1 * | 2/2006 | Ivanov | 438/622 |
| 2007/0023919 A1 | 2/2007 | Lin et al. | |
| 2008/0258309 A1 * | 10/2008 | Chiou | H01L 21/76898 257/774 |
| 2011/0006415 A1 | 1/2011 | Bachman et al. | |

* cited by examiner

CONTACT PAD STRUCTURE, AN ELECTRONIC COMPONENT, AND A METHOD FOR MANUFACTURING A CONTACT PAD STRUCTURE

TECHNICAL FIELD

Various embodiments relate generally to a contact pad structure, an electronic component, and a method for manufacturing a contact pad structure

BACKGROUND

In general, an integrated circuit structure or a chip may be electrically connected to a metallization structure or may include a wiring structure to address the electronic structure elements of the integrated circuit structure or to allow the functioning of the chip. The metallization structure may be a single level metallization or a multilevel metallization including up to ten metallization layers or even more than ten metallization layers. Thus, the metallization layers may be electrically conductively coupled with each other by one or more vias. A metallization layer may include for example a dielectric material and a wiring structure, wherein the dielectric material may provide a support for the wiring structure. Commonly, a metallization layer may provide contact pads to electrically conductively connect the integrated circuit structure or the chip to a peripheral structure.

SUMMARY

According to various embodiments, a contact pad structure may be provided, the contact pad structure may include: a dielectric layer structure; at least one contact pad being in physical contact with the dielectric layer structure; the at least one contact pad including a metal structure and a liner structure, wherein the liner structure is disposed between the metal structure of the at least one contact pad and the dielectric layer structure, and wherein a surface of the at least one contact pad is at least partially free from the liner structure, and a contact structure including an electrically conductive material; the contact structure completely covering at least the surface being at least partially free from the liner structure of the at least one contact pad, wherein the liner structure and the contact structure form a diffusion bather for a material of the metal structure of the at least one contact pad.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
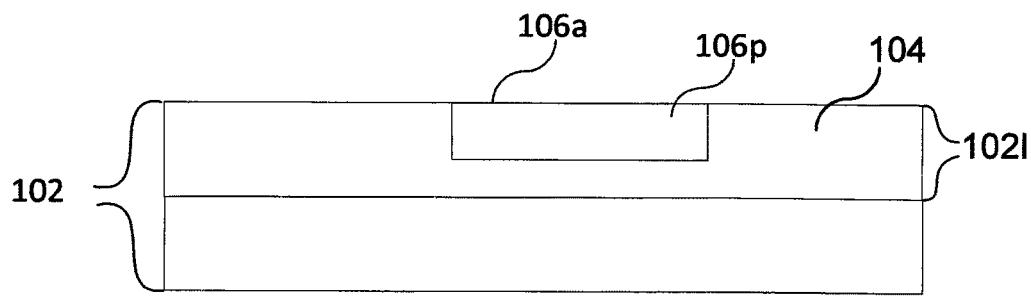
FIGS. 1A to 1C respectively show a contact pad in a commonly used contact pad design.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a carrier) or "laterally" overlapping, may be used herein to mean an extension along a direction parallel to a surface of a carrier. That means that a surface of a carrier (e.g. a surface of a substrate, or a surface of a wafer) may serve as reference, commonly referred to as the main processing surface of a wafer (or the main processing surface of another type of carrier). Further, the term "width" used with regards to a "width" of a structure (or of a structure element, e.g. a cavity) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier).

A metallization of an integrated circuit may include a dielectric layer including an electrically insulating material, wherein the dielectric layer may be configured to provide at least one of recesses, voids, holes, through holes, and the like, being filled with an electrically conductive material to provide a wiring layer structure; the wiring layer structure may include one or more metal lines, one or more vias, and one or more contact structures. A contact structure may for example include at least one contact pad, being exposed at an upper surface of a dielectric layer such that an access to the wiring layer structure may be provided.

The one or more contact pads of the last (e.g. the final) metallization layer may be adapted such that a specific material can be used in a following process to electrically contact the one or more contact pads of the last metallization layer, e.g. the one or more contact pads of the last (e.g. the final) metallization layer may be covered with at least one material to provide a surface layer being suitable to attach for example a bond wire. As an example, the one or more contact pads of the last (e.g. the final) metallization layer may include for example copper and/or aluminum, which may not provide a suitable interface for electrically connecting a gold bond wire. In other words, if the material of a contact pad may not match to a bond wire including a specific bond wire material (or another contact structure including a specific material), it may not be possible to connect the bond wire to the contact pad in a sufficient high quality. Therefore, the contact pad may be covered with one or more additional materials or the contact pad may be adapted such that a bond wire or another contact structure can be electrically connected to the contact pad.

Illustratively, various embodiments described in the following may be based on the realization that a contact pad structure including a contact structure (e.g. a contact pad coating) being disposed over a wiring structure may be prone to faults and/or may not be long term stable, since the material of the wiring structure may diffuse from the metallization structure to the top of the contact pad structure or to the top of the contact structure. Therefore, the wiring structure of the last metallization layer may lose its integrity which may affect the ability to provide a current flow within the metallization. Further, the diffused material settling on top of the contact pad structure may short circuit the contact structures being disposed over the wiring structure, e.g. at least one contact structure may be electrically connected to another electrical component or to another contact being disposed over the metallization layer. Further, the contact pad coating (e.g. the contact structure) may be used to enhance the mechanical robustness of the contact pad.

As shown for example in FIG. 1A, a commonly used metallization structure 102 may include for example one or more metallization layers, and therefore, without loss of generality, a commonly used metallization structure 102 may include a last metallization layer 102l. The last metallization layer 102l may include for example at least one metallization contact pad 106p (or contact pad 106p). The metallization contact pad 106p may include an exposed upper surface 106a to electrically connect the metallization structure 102 to a peripheral structure and/or to electrically contact the metallization structure 102. The metallization structure 102 may be based on at least one of copper technology and aluminum technology; and therefore, the metallization contact pad 106p may include for example copper and/or aluminum.

Figure 1B:
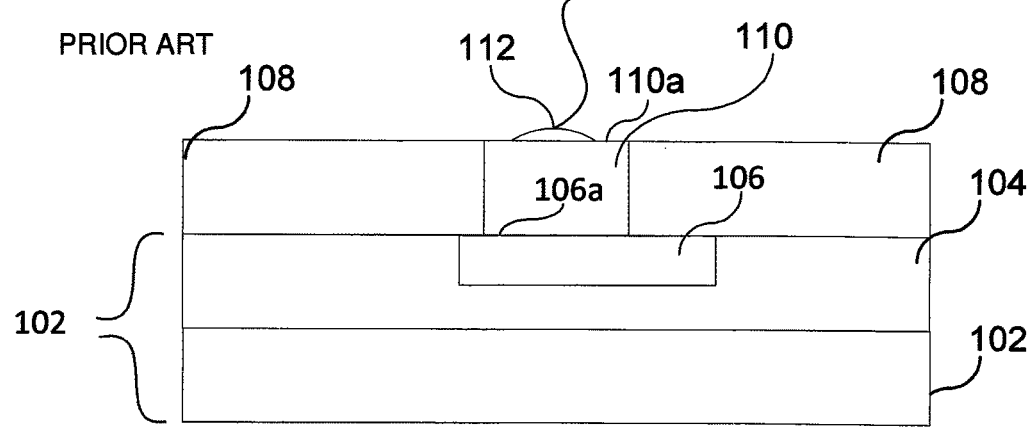

Referring to this, it may be difficult to attach for example a gold bond wire to the upper surface 106a of the metallization contact pad 106p; the attached bond wire may for example peel of easily from the metallization contact 106p since the adhesion between the attached bond wire and the metallization contact 106p may be small and/or the metallization contact 106p may degrade over time. Therefore, the metallization contact pad 106p may be covered with a contact structure 110 (e.g. a contact pad coating 110), wherein the contact structure 110 may include a layer stack or a material structure which may allow connecting a gold bond wire 112 to the upper surface 110a of the contact structure 110, such that the metallization contact pad 106p may be electrically conductively connected to the gold bond wire 112 with a sufficient high adhesion to provide a long term stable connection, as illustrated in FIG. 1B. In analogy, the contact structure 110 may be adapted to provide a desired contact surface 110a to electrically connect the metallization contact 106p to a desired contacting structure.

Illustratively, the quality of an electrical connection between a contact pad 106p (e.g. a contact pad included in the last metallization layer) and another connection structure 112 (e.g. a bond wire and/or a peripheral connection structure) may be influenced by at least one of the following: the materials being in contact with each other, the thermal expansion properties of the involved materials and structures, the surface morphology of the upper surface of the contact pad, as well as the long term behavior of the involved materials and structures, e.g. the diffusion behavior, and the like. Therefore, the contact structure 110 may be configured to provide an enhanced contact surface 110a for electrically conductively contacting the contact pad 106.

Figure 1C:
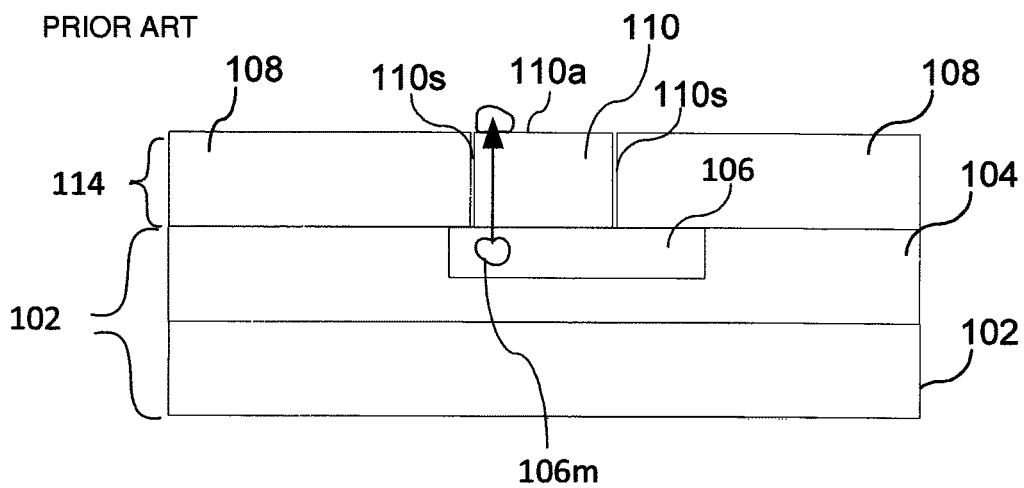

However, as illustrated in FIG. 1C, there may be the problem, that at least a part 106m of the material of the metallization contact 106p, e.g. a part of the copper and/or aluminum included in the contact pad 106, may diffuse to the upper surface 110a of the contact structure 110. Thereby, the metallization contact pad 106p below the contact structure 110 may be damaged and/or the diffused material settling on the upper surface 110a of the contact structure 110 may cause for example a short circuit.

Illustratively, various embodiments described herein may base on the understanding, that the diffusion of a material 106m of the metallization contact 106p may be driven by the interface 110s between the contact structure 110 and a passivation layer structure 108 (e.g. a patterned dielectric layer) generally surrounding the contact structure 110. In other words, an additional structure 114 including the passivation layer structure 108 and the contact structure 110 to provide a suitable contact surface 110a for electrically conductively contacting the metallization contact pad 106p may cause the diffusion of a part of the material 106m of the metallization contact pad 106p, since the interface between the passivation layer structure 108 and the contact structure 110 may be too loose to prevent material diffusion from the metallization contact pad 106p or to prevent the leaking of metallization contact material 106m.

In the following, according to various embodiments, a contact pad structure may be provided including a contact pad being covered with a contact structure, wherein the contact pad structure may be configured to prevent or at least reduce the diffusion and/or migration of material from the contact pad to the surface of the contact pad structure. Further, according to various embodiments, the contact structure covering the contact pad may be adapted to provide a suitable surface layer to electrically connect a desired connection structure. According to various embodiments, the contact pad may be manufactured in a dual-damascene copper plating process. Further, the contact structure may include a hard-coating including an electro-less plated layer stack, the electro-less plated layer stack may include a nickel-phosphorus layer, a palladium layer, and a gold layer. Therefore, the metallization contact pad of the last metallization layer may be adapted by depositing a hard-coating over the metallization contact pad, wherein the hard-coating and the metallization contact pad may be configured and/or relatively arranged to each other to reduce or prevent the leaking of contact pad material of the metallization contact pad.

According to various embodiments, a contact pad structure may be provided having an improved reliability and/or manufacturability compared to conventional contact pads. It has been recognized that a small slit 110s between the dielectric passivation 108 and an electro-less coating 110 over the contact pad 106 may be a path for an attack of the contact pad 106 (e.g. the contact pad 106 including copper) during e.g. the electroless deposition of a gold layer by e.g. gold-flash chemistry. Further, it has been recognized that the small slit 110s between the dielectric passivation 108 and the electro-less coating over the contact pad 106 may be a path for an attack of the contact pad 106 by oxygen and/or humidity. This may reduce the lifetime and reliability of a conventionally manufactured contact pad structure as described referring to FIGS. 1A to 1C. Further, the small slit 110s between the dielectric passivation 108 and the electro-less coating 110 may include an interface between the dielectric material of the dielectric passivation 108 and the electrically conductive material included in the electro-less coating 110, since this interface may allow diffusion and/or migration of material on atomic level (even if there may be no slit detectable).

Since there may be many individual processes used in semiconductor processing (e.g. during the manufacture of an integrated circuit, a metallization layer, and/or a contact pad coating, e.g. during front-end-of-line processing a carrier or a wafer and back-end-of-line processing a carrier or a wafer), usually carried out in sequence, several basic manufacturing techniques may be used at least once in the overall manufacturing process. The following description of basic techniques should be understood as illustrating examples, which techniques may be included in the processes described herein or which techniques may be used to provide a contact pad structure as described herein. The exemplarily described basic techniques may be not necessarily need to be construed as preferred or advantageous over other techniques or methods, since they only serve to illustrate how one or more embodiments of the invention may be practiced. For sake of brevity, the illustration of exemplarily described basic techniques may be only a short overview and should not be considered as exhaustive specification.

According to various embodiments, forming a layer (e.g. depositing a layer, depositing a material, and/or applying a layering process) as described herein may also include forming a layer, wherein the layer may include various sub-layers, whereby different sub-layers may include different materials respectively. In other words, various different sub-layers may be included in a layer, or various different regions may be included in a deposited layer and/or in a deposited material.

According to various embodiments, at least one layering or at least one layering process may be used in a method for manufacturing a contact pad structure or a metallization structure (a dielectric layer or a wiring layer), as described herein. In a layering process, a layer (also generally referred to as film or thin film) may be deposited over a surface (e.g. over a carrier, over a wafer, over a substrate, over another layer, over a plurality of structure elements, and the like) using deposition techniques which may include chemical vapor deposition (CVD, or a CVD process) and/or physical vapor deposition (PVD, or a PVD process), according to various embodiments. The thickness of a deposited layer may be in the range of a few nanometers up to several micrometers depending on its specific function. The thickness of a deposited layer may be regarded as the spatial extension of the deposited layer along its growth direction. Thin layers in the range of a few nanometers, e.g. having a layer thickness smaller than 50 nm, may be formed using an atomic layer deposition (ALD). A conformal layer, e.g. covering the sidewalls of a structure element or covering vertical sidewalls, may be formed using an atomic layer deposition (ALD) or another suitable conformal deposition process, as for example low pressure chemical vapor deposition (LPCVD).

According to various embodiments, a deposited (formed or provided) layer may include at least one of an electrically insulating material, an electrically semiconducting material, and/or an electrically conductive material, depending on the respective specific function of the deposited layer. According to various embodiments, electrically conductive materials, as for example aluminium, aluminium-silicon alloys, aluminium-copper alloys, copper, nichrome (an alloy of nickel, chromium, and/or iron), tungsten, titanium, titanium nitride, molybdenum, platinum, gold, carbon (graphite), or the like, may be deposited using a CVD process or a PVD process. According to various embodiments, semiconducting materials, as for example silicon (e.g. silicon, polycrystalline silicon (also referred to as polysilicon), or amorphous silicon), germanium, a semiconductor compound material such as gallium arsenide (GaAs), indium phosphide (InP), or indium gallium arsenide (InGaAs) may be deposited using a CVD process. Insulating materials, as for example silicon oxide, silicon nitride, silicon oxynitride, metal oxides (e.g. aluminum oxide), organic compounds, polymers, (or the like) may be deposited using a CVD process or a PVD process. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, silicon, polysilicon, amorphous silicon, silicon dioxide, silicon nitride, and the like may be deposited using LPCVD or ALCVD. According to various embodiments, for example platinum, palladium, gold, titanium nitride, titanium oxide, may be deposited using atomic layer deposition (ALD or ALCVD).

According to various embodiments, a physical vapor deposition process may include a variety of modifications, as for example magnetron sputtering, ion-beam sputtering (IBS), reactive sputtering, high-power impulse magnetron sputtering (HIPIMS), vacuum evaporation, molecular beam epitaxy (MBE), and the like.

According to various embodiments, a layering process may further include thermal oxidation (also referred to as thermal oxidation process). According to various embodiments, thermal oxidation may be used to grow high quality silicon oxide layers (so-called high temperature oxide layer (HTO)) on a silicon surface, e.g. at a temperatures in the range from about 800° C. to about 1200° C. The thermal oxidation may be performed at atmospheric pressure or at high pressure and as further modification as a rapid thermal oxidation process (RTO). According to various embodiments, also thermal nitridation may be applied to generate high quality nitride or oxynitride layers (e.g. silicon nitride layers or silicon oxynitride layers), e.g. using rapid thermal nitridation (e.g. at temperatures up to about 1300° C.).

Further, according to various embodiments, a process which may be applied to generate a metal layer may be plating, e.g. electroplating or electroless plating. According to various embodiments, a plating process may be used for forming a metal wiring structure or a metallization structure. According to various embodiments, a metallization structure may include for example one or more metal lines and one or more vias, and one or more contact pads being for example exposed at the upper surface of a metallization layer.

It should be noted, that a variety of combinations of materials and processes may be used in a layering process, according to various embodiments. Depending on specific aspects or desired properties of the layer to be formed, as for example crystalline quality, surface roughness, edge covering behavior, growth speed, and yield, the most suitable process may be applied for the respective material, according to various embodiments.

According to various embodiments, some processes during manufacture of an integrated circuit may require a conformally deposited layer or conformally depositing a layer (e.g. for forming a layer stack over a sidewall of a structure element), which means that a layer (or a material forming a layer) may exhibit only small thickness variations along an interface with another body, e.g. a layer may exhibit only small thickness variations along edges, steps or other elements of the morphology of the interface. According to various embodiments, layering processes such as plating, atomic layer deposition (ALD), or several CVD processes (e.g. ALCVD, or LPCVD), plating (e.g. electroless (ELESS) plating) may be suitable to generate a conformal layer or a conformally deposited layer of a material.

According to various embodiments, at least one patterning or at least one patterning process may be used for forming an integrated circuit, metallization structure, a contact pad structure, and the like, as described herein. A patterning process may include removing selected portions of a surface layer or of a material. After a surface layer may be partially removed, a pattern (or a patterned layer or patterned surface layer or a plurality of structure elements) may remain at least one of over and in the subjacent structure (e.g. a patterned base layer may remain on a subjacent structure). Since a plurality of processes may be involved, according to various embodiments, there are various possibilities to perform a patterning process, wherein aspects may be: selecting at least one portion of a surface layer (or at least one portion of a material, or at least one portion of a wafer) which shall be removed, e.g. via at least one lithographic process; and removing the selected portions of a surface layer, e.g. via at least one etch process.

According to various embodiments, a variety of lithographic processes may be applied generating a lithographic mask (a so-called photomask), as for example photolithography, microlithography or nanolithography, electron beam lithography, X-ray lithography, extreme ultraviolet lithography (EUV or EUVL), interference lithography, and the like. A lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

A cleaning process, which may be included in a lithographic process (or which may be included in a general process in semiconductor processing), may be applied to remove organic or inorganic contaminations (or material) from a surface (e.g. from a surface layer, from a carrier, from a wafer, and the like) for example via wet chemical treatment. The cleaning process may include at least one of the following processes: RCA (Radio Corporation of America) cleaning (also known as Organic Clean (SC1) and Ionic Clean (SC2)); SCROD (single-wafer spin cleaning with repetitive use of ozonized water and diluted HF); IMEC wafer cleaning; post chemical mechanical polishing (post-CMP) cleaning process; cleaning via de-ionized water (DIW), piranha etch and/or a metal etch; (and the like). According to various embodiments, a cleaning process may also be applied for removing a thin oxide layer (e.g. a thin silicon oxide layer) from a surface (e.g. from a surface layer, from a carrier, or from a wafer, and the like).

According to various embodiments, a preparation process, which may be included in a lithographic process, may be applied to promote the adhesion of the photoresist to a surface (e.g. to a surface layer, to a carrier, or to a wafer, and the like). The preparation process may include applying a liquid or gaseous adhesion promoter (e.g. bis(trimethylsilyl) amine (HMDS)).

A resist, which may be included in a lithographic process, may be applied to cover a surface (e.g. a surface layer, a carrier, or a wafer, and the like) homogeneously. Applying a resist may include spin coating to generate a thin layer of the resist. Afterwards, a resist may be prebaked to drive off excess resist solvent, according to various embodiments. Several types of resists (e.g. a photoresist) may be used adapted to the process of exposing the resist to achieve desired results. Positive photoresists (e.g. DNQ-Novolac, PMMA, PMIPK, PBS, and the like) may be used, and/or negative photoresists (e.g. SU-8, poly isoprene, COP, and the like) may be used.

According to various embodiments, a lithographic process may include exposing a resist so that a desired pattern may be transferred to the resist, e.g. by using light or electrons, wherein the desired pattern may be defined by a patterned mask (e.g. a glass carrier with a patterned chromium layer). Mask-less lithography may be applied, wherein a precise beam (e.g. an electron beam or a laser beam) may be projected without using a mask directly onto the surface including the resist. The wavelength of the used light may range from the wavelength of the visible light to a smaller wavelength in the ultra violet range. The exposure may be performed using X-rays or electrons having even a shorter wavelength than ultra violet light. Projection exposure systems (steppers or scanners) may be used projecting the mask many times onto a surface including a resist to create the complete exposure pattern.

A lithographic process may include developing a resist (e.g. developing a photoresist using a photoresist developer), to partially remove the resist generating a patterned resist layer remaining on the surface (e.g. on a surface layer or on a carrier, a wafer, and the like). Developing a resist may include a post exposure bake (a heat treatment, e.g. rapid thermal processing) before the actual developing process may be performed. The developing process may include a chemical solution (a so-called developer) as for example sodium hydroxide or tetramethylammonium hydroxide (TMAH, a metal ion free developer). According to various embodiments, the remaining patterned resist may be solidified in a hard bake process (a heat treatment, e.g. rapid thermal processing), realizing a more durable protecting layer for later processes as for example ion implantation, wet chemical etching, or plasma etching (and the like).

Independently of the described lithographic processes, a resist may be removed completely at a desired processing stage (e.g. after at least one of an etch process, ion implantation process, and a deposition process have been performed) in a so-called resist strip process. A resist may be removed chemically and/or by using oxygen plasma.

It should be noted, that a lithographic process, including applying a resist, exposing a resist, and developing a resist may also be considered as a patterning process, wherein a patterned resist layer (a soft mask, or a resist mask) may be generated by the lithographic process. Subsequently, a pattern may be transferred from a patterned resist layer to a previously deposited or grown layer (or a carrier, and the like) using an etch process, wherein the previously deposited or grown layer may include a hard mask material as for example an oxide or a nitride (e.g. silicon oxide, e.g. silicon nitride) creating a so-called hard mask.

According to various embodiments, an etch process, which may be included for example in a patterning process or which may be used for forming a cavity and/or a recess, may be applied to remove material from a previously deposited layer, a grown surface layer, a carrier (or substrate, or wafer), and the like. An etch process may be adapted and performed depending on the specific requirements for the desired process. An etch process may include a wet etch process and/or a dry etch process. An etch process may be selective or non-selective with respect to two different materials or may be configured to be selective or non-selective, wherein a selective etch process may provide a different etching rate for a first material than for a second material and a non-selective etch process may provide the same etching rate for a first material and a second material. An etch process may be isotropic or anisotropic or may be configured to be isotropic or anisotropic, wherein an anisotropic etch process may have different etching rates along different spatial directions and an isotropic etch process may have the same etching rates along all spatial directions. An etch process may be anisotropic due to different etching rates along different crystallographic directions of the material to be etched. An etch process using a masking material and a dry etch process (e.g. plasma etching or reactive ion etching) may allow forming anisotropic structures, e.g. recesses.

According to various embodiments, a selective etch process may include a specific etchant (e.g. a wet etchant, e.g. a plasma etchant) which may allow etching at least one desired material while sparing another material, e.g. an exposed region of a layer or carrier may be removed (etched) while a mask material (or another material) may remain. Silicon dioxide may be removed (etched) selectively compared to silicon by using hydrofluoric acid ($HF_{aq}$) as etchant. Silicon dioxide may be removed (etched) together with silicon (non-selectively) by using a mixture of nitric acid and hydrofluoric acid ($HNO_3/HF_{aq}$) as etchant.

According to various embodiments, an anisotropic wet etch process may reveal a different etching rate along a respective crystallographic direction of a specific material. A wet etch process including potassium hydroxide (KOH) as etchant may be performed to etch silicon (e.g. a silicon wafer) anisotropically. A wet etch process including ($HNO_3/HF_{aq}$) as etchant may be performed to etch silicon (e.g. a silicon wafer) isotropically. An anisotropic dry etch process may reveal a different etching rate for surfaces with a specific geometric alignment. A physical etch process may be applied (e.g. ion beam milling, e.g. plasma etching) to perform an anisotropic removal of a material.

Further, to create at least one of a deep penetration, a steep-sided hole, and a trench in a material (e.g. in a wafer, in a substrate, in a deposited or grown layer, and the like) deep reactive-ion etching (DRIE) may be applied. A pulsed etching (time-multiplexed etching) may be applied.

According to various embodiments, a patterned layer may also serve as a mask (a so-called hard mask) for other processes like etching, ion implantation, and/or layering. Further, a patterned photoresist may also serve as a mask (a so-called soft mask). The mask material may usually be selected with regard to specific needs as for example chemical stability, e.g. to perform a selective etch process which does not affect the mask material (e.g. which may not etch away the mask material completely), or mechanical stability, e.g. to protect regions from being penetrated by ions, or to define the shape of generated structure elements during a layering process, and the like.

According to various embodiments, a heat treatment may be applied for forming an integrated circuit structure or a contact pad structure; or a heat treatment may be included in various processes (or at various process stages) during manufacture of a contact pad structure or a metallization structure, as described herein, e.g. in combination with a patterning process, after applying photoresist, and/or after depositing electrical contacts to alloy the electrically conductive material (e.g. a metal) with a carrier (or with the subjacent structure), or to provide optimal deposition conditions for a layering process. The heating of a carrier (a wafer, a substrate, and the like) may be performed with direct contact, e.g. a hot plate, or by radiation, e.g. using a laser or lamps. A rapid thermal processing (RTP) may be applied, which may be performed under vacuum conditions using a laser heater or lamp heater, wherein a material (e.g. a wafer, a substrate, a carrier, and the like) may be heated up to several hundred degrees Celsius or up to about 1000° C. or even greater within a short time period, e.g. within several seconds (e.g. about 1 s to about 10 s). Subsets of rapid thermal processing are rapid thermal annealing (RTA) and rapid thermal oxidation (RTO).

At least one metallization process may be applied in a method for manufacturing a contact pad structure. A metallization may be in direct contact with at least one structure element of an electronic circuit (or with at least one structure on a carrier), wherein a metallization process may be used to provide required electrical connections (or interconnections) for the electronic circuit and or an integrated circuit on a carrier. A metallization process may include at least one layering process and at least one patterning process. A metallization process may include depositing a layer of a dielectric material (e.g. a low-k dielectric material, e.g. undoped silicate glass, and the like), forming contact holes at the desired locations (e.g. using at least one patterning process), and filling the contact holes with at least one electrically conductive material (e.g. with at least one of a metal (e.g. aluminium, copper, tungsten, titanium, molybdenum, gold, platinum, and the like), a metallic material (e.g. titanium nitride, platinum silicide, titanium silicide, tungsten silicide, molybdenum silicide, and the like), electrically conductive polysilicon, and a metal alloy (e.g. aluminium-silicon alloys, aluminium-copper alloys, aluminium-silicon-copper alloys, nichrome, titanium-tungsten alloys, and the like)) using a layering process. Further, a metallization process (or a metallization process) may include forming additional layers for example as a bather (e.g. including at least one of molybdenum, a transition metal nitride (e.g. titanium nitride), platinum silicide, titanium silicide, tungsten silicide, molybdenum silicide, borides, tantalum, tungsten, and the like), or as adhesion promoter (e.g. including at least one of platinum silicide, titanium silicide, tungsten silicide, molybdenum silicide, and the like). Further, a dielectric layer may include a layer stack, e.g. one or more layer being disposed over each other, including for example silicon oxide, silicon nitride, and/or silicon oxynitride. A dielectric layer silicon oxide, silicon nitride, and/or silicon oxynitride may be used as a final dielectric layer or a final passivation layer on the top of the metallization. Further, an inter-level dielectric or inter-layer dielectric (ILD), may be used to electrically separate the components of a wiring structure (e.g. interconnect lines, contact pads, and the like) being arranged in several levels of a multilevel metallization or being arrange in a metallization layer of a multilevel metallization. The ILD may include low-k dielectric material (e.g. silicon oxide, porous silicon, and the like) to reduce the electrical coupling between adjacent components of the wiring structure.

According to various embodiments, applying a metallization process may further include a planarization of a carrier surface (wafer surface, substrate surface, and the like) and/or a planarization of intermediate layers included in a multilevel metallization process (e.g. using chemical mechanical polishing (CMP)).

A planarization process may be applied for example to reduce the surface roughness or to reduced variations in the depth profile of a surface of a carrier including structure elements having different heights, since some processes may require a flat surface (a planar surface) (e.g. high resolution lithography). A planarization process may be desired as the number of performed layering processes and patterning processes increases and as a planar surface may be required. A chemical mechanical polishing process (CMP or CMP process) may be performed, wherein this process may be selective to specific materials on the surface of a carrier (of a wafer, substrate, surface layer, and the like). A chemical mechanical polishing process (CMP) may be performed, wherein this process may be non-selective to specific materials on the surface of a carrier (of a wafer, substrate, surface layer, and the like). A planarization process may be included additionally in several processes, e.g. in layering processes, patterning processes, and the like. A chemical mechanical polishing process (CMP) may be used to remove a surface layer or a part of a surface layer.

According to various embodiments, a plating process (e.g. electroless plating, e.g. electroplating) may be applied to provide a contact structure or e.g. a hard-coating for a contact pad. Electrically conductive materials like gold, silver, palladium, nickel, aluminum, copper and/or compounds like nickel-phosphorous, may be deposited using a plating process. An electroless plating may provide for example thin electrically conductive layers having beneficial mechanical properties, e.g. a high quality interface to the underlying material and/or a high adhesion to the underlying structure.

According to various embodiments, a carrier (e.g. a substrate, a wafer, and the like) may be made of semiconductor materials of various types, including silicon, germanium, Group III to V or other types, including polymers, for example, although in another embodiment, other suitable materials can also be used. The wafer substrate may be made of silicon (doped or undoped), in an alternative embodiment, the wafer substrate may be a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs). A carrier may include a coated structure, e.g. a metal tape coated with silicon, and the like. A carrier may further include a polymer, a laminate, or a metal.

In the following, a contact pad structure may be provided being configured such that the contact pad of the metallization structure may be long term stable, wherein the contact pad may not degrade and/or the material of the contact pad may not leak. Further, the contact pad structure may be stable up to temperatures of about 400° C. or even up to higher temperatures, since the diffusion of the material from the contact pad may be prevented, as described in the following.

The term "diffusion" or "diffuse" may be used herein to describe the diffusion of material, which may be understood as a material transport or a material displacement independently of the driving force for the diffusion. Further, the diffusion may be understood as a migration of a material. A result of the diffusion may be the removal of a material at a first location and the agglomeration (deposition) of the removed material at a second location. The driving force causing diffusion may be at least one of the following: a temperature gradient, a concentration gradient, capillary forces, a pressure gradient, a chemical potential, the thermal expansion of a material, a thermal compression of a material, current driven migration, and the like.

The term "dielectric" as used herein referring to a dielectric material, a dielectric layer, a dielectric structure, and the like, may be used herein to mean an electrically insulating material in general. Further the term "dielectric" may refer to a so-called low-κ material, as typically used in metallization structures in any semiconductor technology. According to various embodiments, at least one of the following materials may be used to provide a dielectric layer or a dielectric structure: silicon oxide (dielectric constant of 3.9) and a material having a smaller a dielectric constant then silicon oxide, e.g. fluorine-doped silicon dioxide, fluorosilicate glass, carbon-doped silicon dioxide, porous silicon dioxide, porous carbon-doped silicon dioxide, organic dielectrics, dielectric polymers, silicone based polymeric dielectrics, polynorbornenes, benzocyclobutene, polytetrafluoroethylene, resins, hydrogen silsesquioxane (HSQ), methylsilsesquioxane (MSQ) and the like.

Figure 2A:
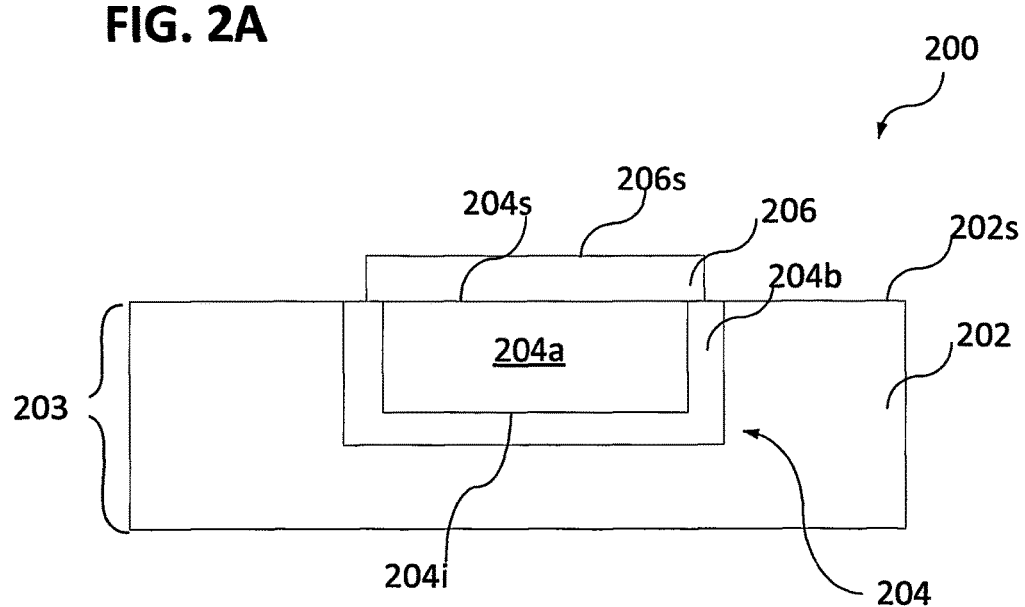
FIGS. 2A to 2C respectively show a contact pad structure, according to various embodiments.

FIG. 2A illustrates a contact pad structure 200 in a cross sectional view or in a side view, according to various embodiments. The contact pad structure 200 may include: a dielectric layer structure 202; at least one contact pad 204 being in physical contact (e.g. mechanically coupled) with the dielectric layer structure 202; the at least one contact pad 204 including a metal structure 204a and a liner structure 204b, wherein the liner structure 204b may be disposed between the metal structure 204a of the at least one contact pad 204 and the dielectric layer structure 202, and wherein a surface 204s of the at least one contact pad 204 may be at least partially free from the liner structure 204b, and a contact structure 206 including an electrically conductive material; the contact structure 206 completely covering at least the surface 204s of the at least one contact pad 204 being at least partially free from the liner structure 204b, wherein the liner structure 204b and the contact structure 206 may form a diffusion bather for a material of the metal structure 204a of the at least one contact pad 204. Further, the liner structure 204b and the contact structure 206 may form a diffusion bather for oxygen and hydrogen, such that the contact structure of the contact pad 204 may be protected.

According to various embodiments, the dielectric layer structure 202 may include a dielectric material, as already described. The dielectric layer structure 202 may include a patterned dielectric layer structure 202 or a patterned dielectric layer; therefore a deposited (e.g. spin coated) dielectric layer may be patterned using a patterning process, as described before. The patterned dielectric layer, e.g. the dielectric layer structure 202, may include at least one of the following structure elements: one or more recesses, one or more voids, one or more through holes, and the like, to provide for example space for an electrically conductive wiring material to provide a wiring structure or a wiring. In other words, an electrical wiring and the dielectric layer structure 202 may provide a metallization layer 203, wherein the electrical wiring may be supported by the dielectric layer structure 202 and/or the components of the electrical wiring (e.g. one or more metal lines, one or more vias, one or more contacts or contact pads, and the like) may be electrically isolated from each other to prevent undesired short-circuits. Further, as usual, the electrical wiring of a metallization layer 203 may include an electrically conductive material, as described before. According to various embodiments, forming the metallization layer 203 may include a copper etch technology and/or an aluminium etch technology. Further, the metallization layer 203 and/or forming the metallization layer 203 may include a so-called dual copper damascene technology, wherein the vias and the metal lines of the metallization layer 203 may be formed in a common process. It has to be noted, that the metallization layer 203 may also be formed in any other semiconductor metallization technology which may provide a contact pad 204 (or another contact structure) mechanically coupled to a dielectric layer 202.

Figure 5A:
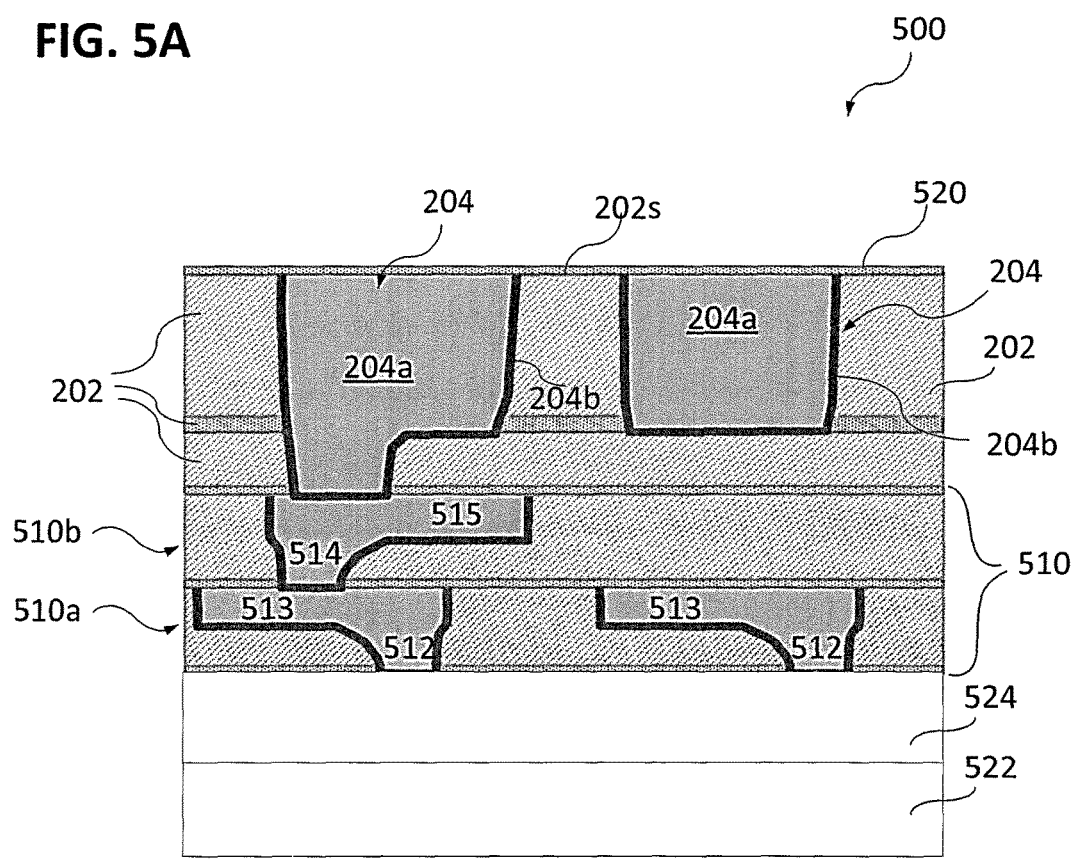
FIGS. 5A to 5C respectively show an electronic component including a contact pad structure, according to various embodiments.
Figure 5B:
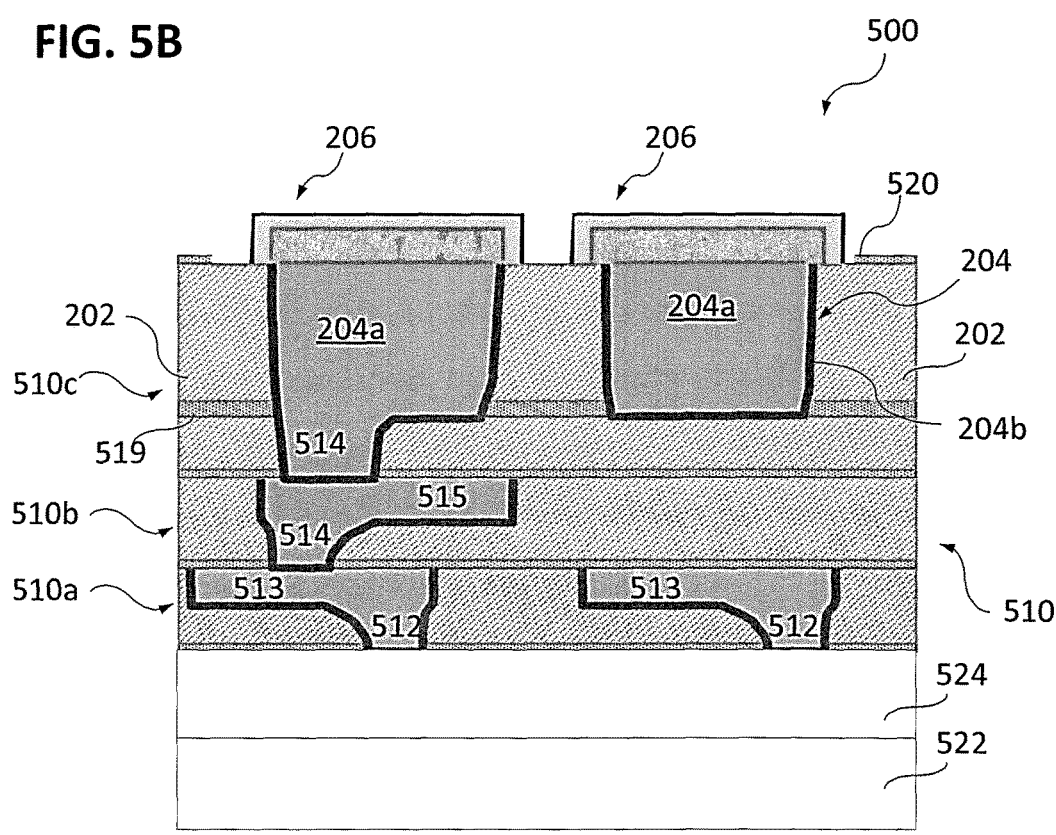
Figure 5C:
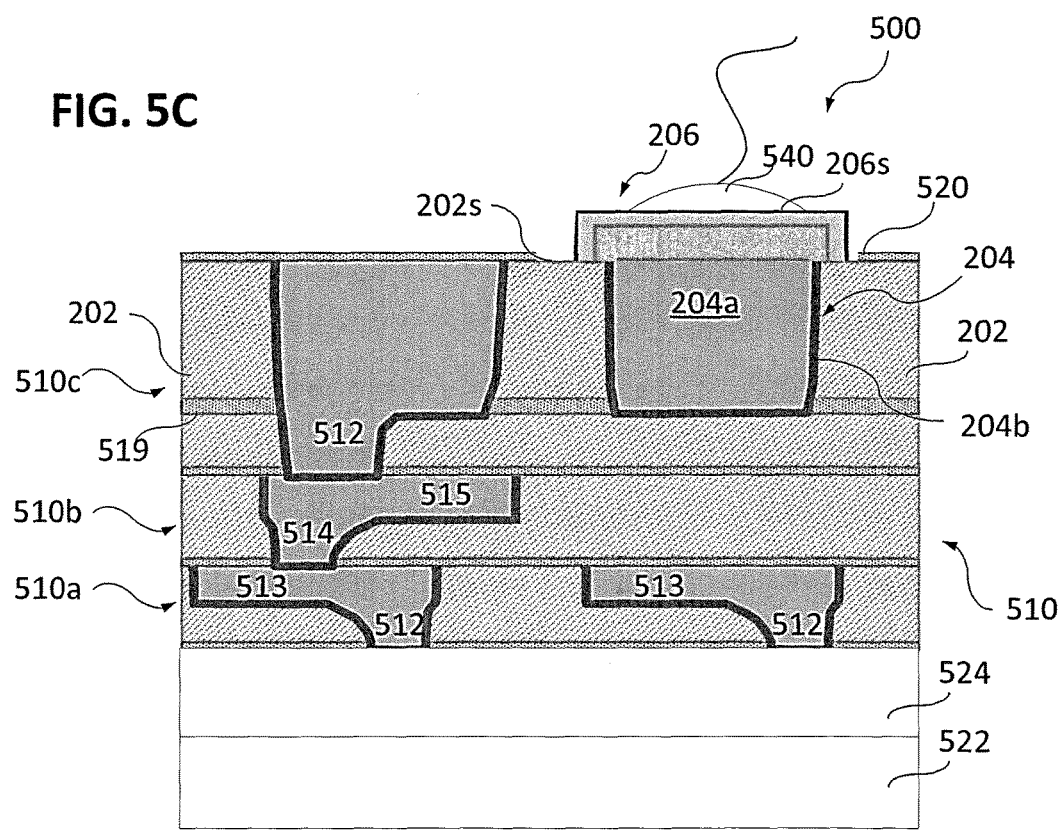

As illustrated in the figures, the contact pad 204 may be partially embedded into the dielectric layer structure 202. According to various embodiments, the contact pad 204 may also be a metallization contact pad structure 204 including for example a plurality of different regions including different materials, e.g. different metals, metal alloys and the like. Further, a layer stack may be utilized to provide the contact pad 204; the layer stack may include a plurality of layers including for example different materials. It goes without saying that the contact pad 204 may be electrically conductive and/or may include an electrically conductive material. According to various embodiments, the contact pad 204 may be electrically conductively connected to a metal line or a wiring structure included in the metallization layer 203. Further, the contact pad 204 may be electrically connected to an additional metallization layer or to a plurality of additional metallization layers provided below the metallization layer 203, e.g. as a part of a multilevel metallization. Therefore, the contact pad 204 may be electrically conductively connected to an integrated circuit or an integrated circuit structure provide below the metallization layer 203 (c.f. FIG. 5A to 5C).

According to various embodiments, the contact pad 204 may include a metal structure 204a; the metal structure may include a metal or a plurality of metals, a metal alloy, or any other electrically conductive material, e.g. doped silicon. Illustratively, the metal structure 204a may provide the core of the contact pad 204. The metal structure 204a may be partially surrounded by a liner structure (a liner) 204b, wherein the liner structure 204b may be arranged between the metal structure 204a and the dielectric layer structure 202 of the metallization layer 203. As illustrated in FIG. 2A, at least one surface 204s of the contact pad 204 may be free of the liner structure 204b, since the least one surface 204s may not have a direct contact to the dielectric layer structure 202. According to this, the metal structure 204a may provide a direct interface 204s for the contact structure 206 being disposed over the contact pad 204. Therefore, at least one surface 204s of the contact pad 204 may be an upper surface 204s. According to various embodiments, the contact pad 204 may be arranged within the dielectric layer structure 202 such that the at least one surface 204s of the contact pad 204 may be substantially coextensive with the upper surface 202s of the dielectric layer structure 202. Alternatively, the contact pad 204 may protrude from the dielectric layer structure 202 or may be flush-mounted (or recessed) within the dielectric layer structure 202 (c.f. FIG. 4C and FIG. 4D).

According to various embodiments, the contact structure 206 may be in direct contact with liner structure 204b of the contact pad 204. Naturally, since the contact structure 206 may be designed to conduct an electrical current, the contact structure 206 may be electrically conductive and/or may include an electrically conductive material. Further, the liner structure 204b may include an electrically conductive material. Therefore, a direct contact of the contact structure 206 and the liner structure 204b may provide an interface being able to reduce or prevent a diffusion or leakage of the material of the metal structure 204a of the contact pad 204 out of the contact pad 204. Illustratively, the liner structure 204b and the contact structure 206 may encapsulate the metal structure 204a of the contact pad 204 (e.g. including copper and/or aluminium) such that the material (copper and/or aluminium) of the metal structure 204a of the contact pad 204 may not diffuse out of the contact pad 204. This may enhance the reliability and the long term stability of the contact pad structure 200, as well as the stability during process of the contact pad structure 200 or during further processing the contact pad structure 200.

FIG. 2A and the following figures respectively show a contact pad structure 200 and an electronic device including a contact pad structure 200 in a schematic view, it goes without saying, that the shape of at least one of: the contact pad 204, the metal structure 204a, the liner structure 204b, the contact structure 206, and the dielectric layer structure 202, may differ from the shape as shown in the figures, wherein the functionality of the contact pad structure 200 as described herein may be preserved as long as the contact structure 206 may for example completely cover the surface or the surfaces of the contact pad 204 being free of liner material or free of the liner structure 204b. In other words, the design of the contact pad structure 200, as illustrated herein, may prevent the direct contact of the metal structure of the contact pad 204 to the dielectric layer structure 202 or, as shown in FIG. 2B, to an additional passivation layer structure 208 being disposed over the dielectric layer structure 202 and/or partially over the contact structure 206.

Figure 2B:
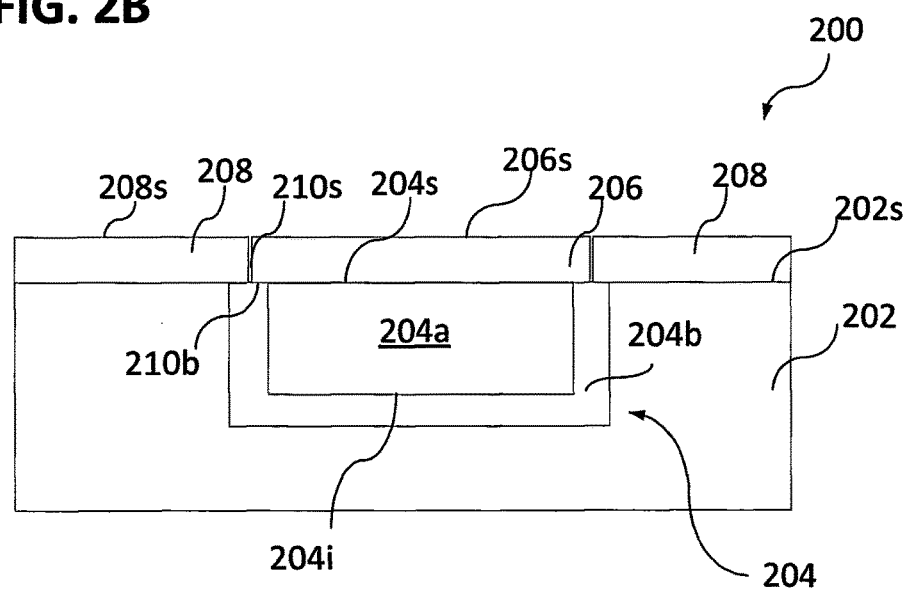

FIG. 2B illustrates a contact pad structure 200 in a cross sectional view or in a side view, according to various embodiments, in analogy to the contact pad structure 200, as shown in FIG. 2A, wherein a passivation layer structure 208 (e.g. an electrically insulating passivation layer structure) may be disposed over the dielectric layer structure 202. The passivation layer structure 208 may cover the dielectric layer structure 202 at least partially, e.g. completely. However, the passivation layer structure 208 may be patterned such that the contact structure 206 may be at least partially exposed, e.g. such that the upper surface 206s of the contact structure 206 may be exposed to provide a contact surface 206s for electrically contacting the contact structure 206 and therefore, for electrically contacting the contact pad 204.

According to various embodiments, the contact pad 204 and the contact structure 206 may be electrically conductively coupled with each other, wherein the contact structure 206 may include a different material than the contact pad 204 or than the metal structure 204b of the contact pad 204. Therefore, according to various embodiments, the contact structure 206 may serve to provide at least one of: a protection for the contact pad 204 (e.g. a chemical protection or a physical protection), a contact surface 206s including another material than the upper surface 204s of the metal structure 204a of the contact pad 204. Referring to this, the contact structure 206 may be used to adapt the physical and chemical properties of the contact surface 206s for electrically contacting the contact pad 204. According to various embodiments, the surface region of the contact structure 206 including the exposed surface 206s may include for example gold, such that a gold bond wire can be attached to the exposed surface 206s for electrically contacting the contact pad 204 via the contact structure 206. Accordingly, a gold bond wire may not have a sufficient high adhesion on the surface 204s of the metal structure 204a of the contact pad 204 which may include for example copper and/or aluminum.

Figure 2C:
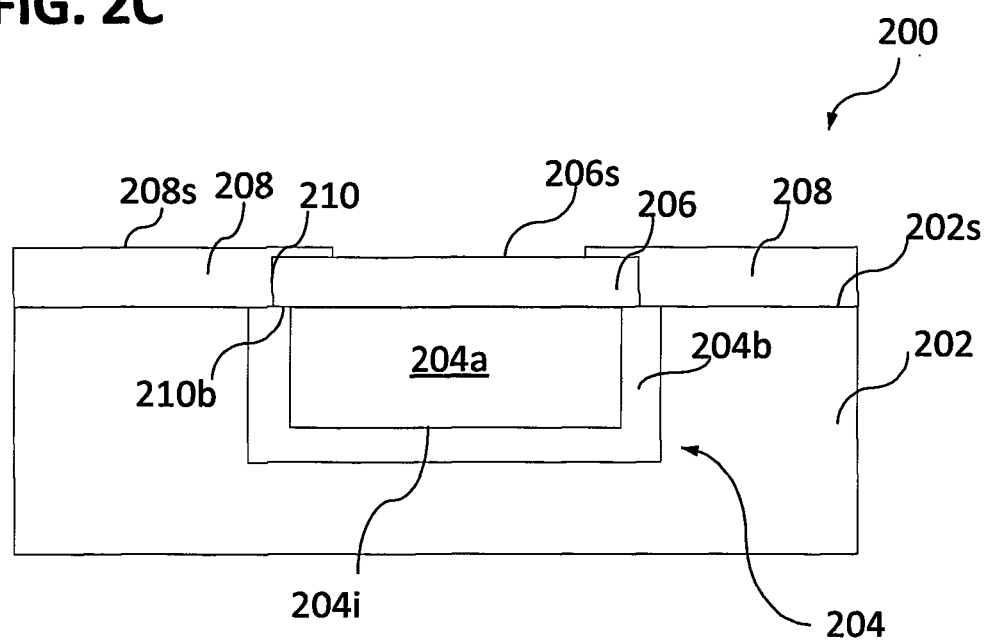

Further, as illustrated in FIG. 2C, the passivation layer structure 208 (e.g. the electrically insulating passivation layer structure) may be disposed over the dielectric layer structure 202 and partially over the upper surface of the contact structure 206. This may enhance for example the mechanical stability and/or chemical stability of the contact structure 206 or of the contact pad structure 200. Illustratively, an overlapping passivation layer structure 208 may reduce or may prevent the attack of water, oxygen, processing chemistry (e.g. etchants, gold etchant, cleaning chemicals, and the like) to the contact pad 204 and/or to the contact structure 206. The passivation layer structure 208 may include one or more layer including at least one material of the following group of materials: a dielectric material, as described before, an oxide, a metal oxide, a nitride, a metal nitride, aluminium oxide, and the like.

According to various embodiments, the slit 210 between the passivation layer structure 208 and the contact structure 206 or a direct interface 210 between the electrically insulating passivation layer structure 208 and the metallic contact structure 206 may generally provide a diffusion channel which may allow a leakage or a diffusion of the material from the metal structure 204a of the contact pad 204 to the surface 206s of the metallic contact structure 206 and/or to the surface 208s of the passivation layer structure 208. Therefore, the contact pad structure 200, as described herein, may be configured such that the slit 210 or the interface 210 may not have a direct contact to the metal structure 204a of the contact pad 204.

According to various embodiments, the interface 210b between the contact structure 206 and the liner structure 204b may be an interface between two electrically conductive materials, which may therefore not allow a substantial diffusion of the material from the metal structure 204a of the contact pad 204 to the surface 206s of the metallic contact structure 206 and/or to the surface 208s of the passivation layer structure 208. Therefore, the arrangement of the slit 210 or the interface 210 between the contact structure 206 and the passivation layer structure 208 above the liner structure 204b of the contact pad 204 or above the dielectric layer structure 202 may enhance the stability of the contact pad 204.

According to various embodiments, the contact pad 204 may also include a via, as shown for example in FIG. 5A.

Figure 3:
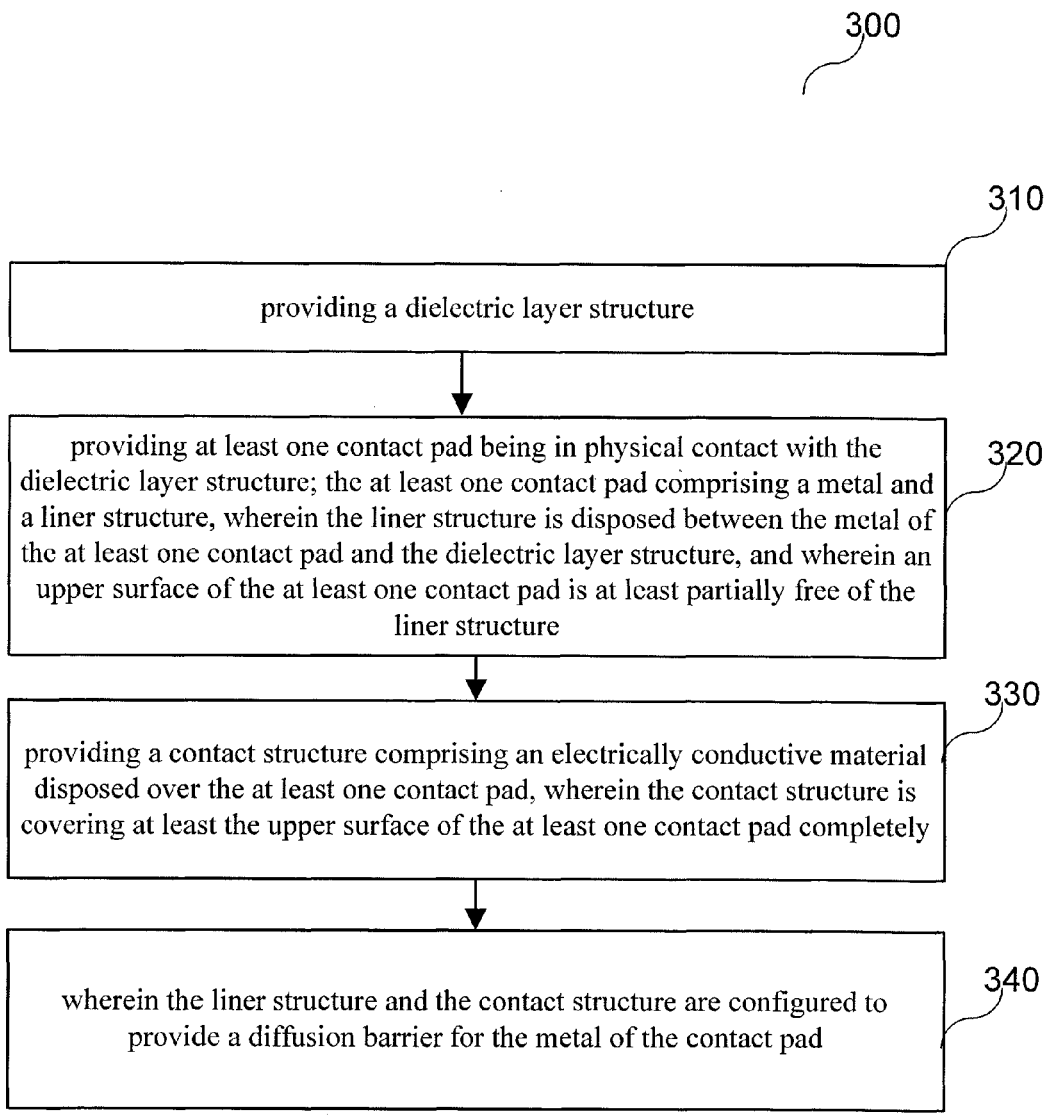
FIG. 3 shows a schematic flow diagram of a method for manufacturing a contact pad structure, according to various embodiments.

FIG. 3 illustrates a schematic flow diagram of a method 300 for manufacturing a contact pad structure 200, as described herein. According to various embodiments, the method for manufacturing a contact pad structure 200 may include: in 310, providing a dielectric layer structure 202; in 320, providing at least one contact pad 204 being in physical contact with the dielectric layer structure 202; the at least one contact pad 204 may include a metal structure 204a and a liner structure 204b, wherein the liner structure 204b may be disposed between the metal structure 204a of the at least one contact pad 204 and the dielectric layer structure 202, and wherein an upper surface 204s of the at least one contact pad 204 may be at least partially free of the liner structure 204b; in 320, providing a contact structure 206 including an electrically conductive material disposed over the at least one contact pad 204, wherein the contact structure 206 is completely covering at least the upper surface 204s being free of the liner structure 204b of the at least one contact pad, wherein the liner structure 204b and the contact structure 206 are configured to provide a diffusion bather for the material of the metal structure 204a of the contact pad 204.

According to various embodiments, the term "providing" as used referring to providing a dielectric layer structure, providing at least one contact pad, and/or providing a contact structure may be used herein to mean forming or processing a carrier such that the respective structure elements are formed. Referring to this, providing may include using at least one semiconductor process as described before, e.g. at least one of: one or more layering processes, one or more patterning processes, one or more etch processes, one or more planarization processes, one or more thermal treatments, and the like.

According to various embodiments, the contact structure 206 may be formed by utilizing an electroless plating process. Therefore, the contact structure 206 and the contact pad 204 may be mechanically connected by a high quality interface, e.g. the interface may provide a high adhesion of the contact structure 206 on the contact pad 204. The contact structure 206 may be a hard-coating for the contact pad 204. A layer or a structure being formed by an electroless plating process may be highly optically reflective, e.g. due to the low intrinsic surface roughness. Further, due to the low intrinsic surface roughness, the layer or the structure may enable using optical methods to determine a defect density. Further, the contact structure 206 and the contact pad 204 being formed by an electroless plating process may have a high hardness such that, e.g., a wire bonding process may be performed without affecting the contact structure 206 and the contact pad 204, and/or such that, e.g., one or more test probe needles, which may be applied to the contact pad 204 during electrical testing, may leave no or substantially no imprints on the contact pad 204 so that, e.g., a bonding nail head may be applied directly onto the probing position(s). Further, the contact structure 206 and the contact pad 204 may be temperature stable, e.g. up to a temperature of larger than about 175° C. Further, the contact structure 206 and the contact pad 204 may be chemically stable, e.g. stable against gold etch chemistry, water, oxygen, and the like.

Further, providing a dielectric layer structure 202 may include for example a spin coating or a CVD process; and further, at least one patterning process to provide a patterned dielectric layer structure serving as support for a wiring structure, and thus forming a metallization layer.

Further, providing at least one contact pad 204 may include providing one contact pad or a plurality of contact pads; wherein the number of contact pads may be limited by a processable wafer size which may limit the lateral extension of the dielectric layer structure 202. Further, providing at least one contact pad 204 may include a plating process, depositing a metal, e.g. filling the patterned dielectric layer structure defining a wiring structure with an electrically conductive material. Further, providing at least one contact pad 204 may include a liftoff process, wherein a wiring layer may be patterned by partially removing a resist an arranged below the part of the wiring layer to be removed.

According to various embodiments, the contact pad 204 may have a lateral extension of about several tens of nanometers up to several tens of micrometers, e.g. a lateral extension (a width) in the range from about 50 nm to about 50 µam, e.g. in the range from about 100 nm to about 10 µm; in the range from about 200 nm to about 3 µm.

Referring to this, the contact structure 206 may for example have a larger lateral extension than the contact pad 204, e.g. a lateral extension in the range from about 60 nm to about 60 µm, e.g. in the range from about 110 nm to about 11 µm; in the range from about 220 nm to about 4 µm. The liner structure 204b may be configured as a conformal liner layer having a thickness in the in the range from about 10 nm to about 1 µm.

According to various embodiments, the method 300 for manufacturing a contact pad structure 200 may further include forming an electrically insulating passivation layer structure 208 over the dielectric layer structure 202. Further, the method 300 for manufacturing a contact pad structure 200 may include a heat treatment, e.g. such that the material of the prior deposited passivation layer structure 208 may be cured. The passivation layer structure 208 may be for example an imide layer, wherein the heat treatment may be performed at a temperature of about 380° C. The passivation layer structure 208 may have a thickness in the in the range from about 10 nm to about 5 μm, e.g. in the in the range from about 100 nm to about 1 μm.

According to various embodiments, the contact pad structure 200 including a contact pad 204 being covered with the contact structure 206, as described herein, may be stable up to a temperature of about 380° C. or even up to higher temperatures.

According to various embodiments, the contact pad 204 may have a thickness (e.g. a height) from about several nanometers to about several micrometers, e.g. a thickness in the range from about 50 nm to about 2 μm, e.g. in the range of about 1200 nm. According to various embodiments, the contact structure 206 may have a thickness (e.g. a height) from about several nanometers to about several micrometers, e.g. a thickness in the range from about 50 nm to about 3 μm, e.g. in the range of about 1.5 μm. Therefore, the contact structure 206 may be or may include a reinforcement structure for the contact pad 204 caused by the thickness of the contact structure 206 and/or the material included in the contact structure 206

Various modifications and/or configurations of the contact pad structure 200 and details referring to the dielectric layer structure 202, the contact pad 204, and the contact structure 206 are described in the following, wherein the features and/or functionalities described referring to FIGS. 2A to 2C, and FIG. 3 may be included analogously. Further, the features and/or functionalities described in the following may be included in the contact pad structure 200 or may be combined with the contact pad structure 200, as described before referring to FIGS. 2A to 2C, and FIG. 3.

Figure 4A:
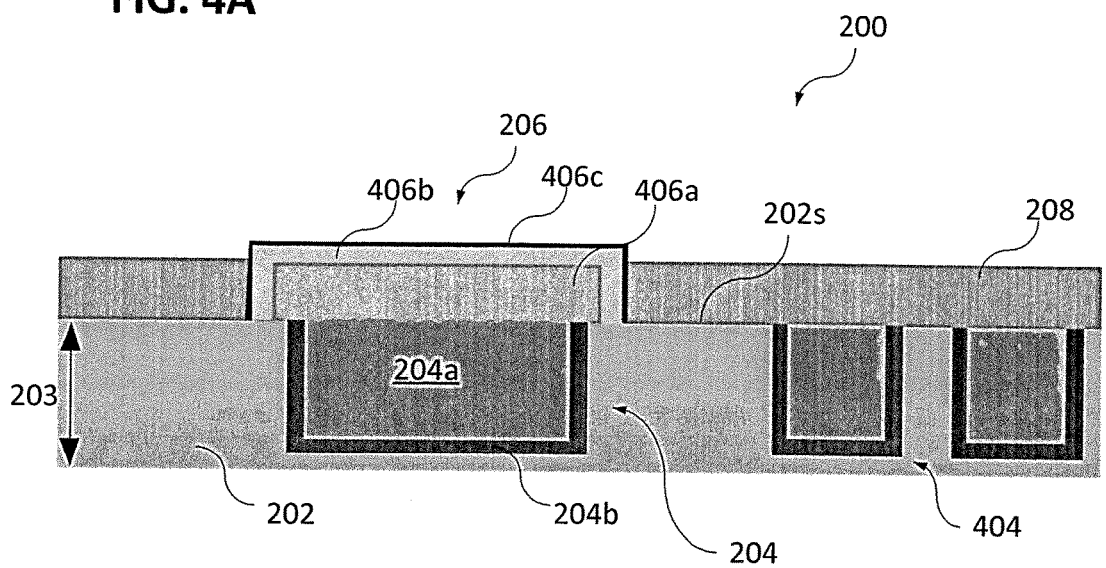
FIGS. 4A to 4E respectively show a contact pad structure, according to various embodiments.

FIG. 4A illustrates a contact pad structure 200 in a cross sectional view or in a side view, according to various embodiments. In analogy to the contact pad structure 200 described before referring to FIGS. 2A to 2C, the contact pad structure 200 shown in FIG. 4A may include an electrically insulating passivation layer 208 being disposed over the dielectric layer structure 208, wherein at least portion, e.g. the upper surface, of the contact structure 206 may be free from the electrically insulating passivation layer 208. This may allow electrically contacting the contact structure 206 and therefore, via the contact structure 206 the electrically contacting of the contact pad 204. The contact pad structure 200 may include a dielectric layer structure 202 including a wiring structure 404, e.g. one or more metal lines, vias, and the like. The contact pad structure 200 may further include at least one contact pad 204, as already described.

According to various embodiments, the contact pad 204 may include at least one material of the following group of materials: copper, aluminum, a copper alloy, an aluminum alloy, copper-aluminum, and any other electrically conductive material being suitable for a wiring structure, e.g. electrically conductive (e.g. doped) silicon.

According to various embodiments, the metallization layer 203 may be the final metallization 203 layer of a metallization structure, or the so-called last metallization layer. Since the dielectric layer structure 202 may be covered with an additional passivation layer 208, the dielectric layer structure 202 may be configured as in interlayer dielectric, as usually provided in a multilevel metallization. According to various embodiments, the dielectric layer structure 202 may include at least one material of the following group of materials: an oxide, a nitride, an oxynitride, silicon oxide, silicon nitride, silicon oxynitride. Further, the dielectric layer structure 202 may include an imide or another dielectric material, as already described.

According to various embodiments, the liner structure may include at least one material of the following group of materials: a transition metal, a rare earth metal, titanium, tantalum, a titanium/tantalum alloy, a silicide, a transition metal silicide, and the like.

As shown in FIG. 4A, the contact structure 206 may include a first contact structure region 406a being disposed over the contact pad 204, the first contact structure region 406a may completely cover the metal structure 204a of the contact pad 204, as already described. The first contact structure region 406a may be configured or may serve as reinforcement for the contact pad 204; the first contact structure region 406a may for example have a thickness (e.g. a height) in the range from about 1 μm, and the first contact structure region 406a may include for example a nickel-phosphorous alloy (e.g. an electroless plated NiP). Referring to this, electroless plated NiP may have a high hardness and a high chemical and mechanical stability such that the first contact structure region 406a may serve as reinforcement for the contact pad 204 or protection structure for the underlying contact pad 204.

As further shown in FIG. 4A, the contact structure 206 may include a second contact structure region 406b being disposed over the contact pad 204 (e.g. at least partially over the first contact structure region 406a). According to various embodiments, the second contact structure region 406b may completely cover the first contact structure region 406a. The second contact structure region 406b may for example include a palladium layer having a thickness in the range from about 10 nm to about 500 nm, e.g. in the range from about 200 nm to about 400 nm, e.g. the thickness of about 300 nm.

As further shown in FIG. 4A, the contact structure 206 may include a third contact structure region 406c being disposed over the contact pad 204 (e.g. at least partially over the second contact structure region 406b). According to various embodiments, the third contact structure region 406c may completely cover the second contact structure region 406b.

The second contact structure region 406a may be a diffusion barrier to prevent or reduce a diffusion of a material of the third contact structure region 406c into the first contact structure region 406a and/or a diffusion of a material of the first contact structure region 406a into the third contact structure region 406c. The second contact structure region 406b may include for example a palladium as a diffusion bather and the third contact structure region 406c may include for example a gold as a contact interface material, wherein the second contact structure region 406b including palladium may prevent or reduce a diffusion of the gold of the third contact structure region 406c into the first contact structure region 406a including for example a NiP.

The contact structure 206, e.g. including the first contact structure region 406a, the second contact structure region 406b, and the third contact structure region 406c may laterally overlap the contact pad 204. Further the contact structure 206 may adjoin the passivation layer 208. The passivation layer 208 may for example partially overlay and/or cover the contact structure 206, as already described.

Figure 4B:
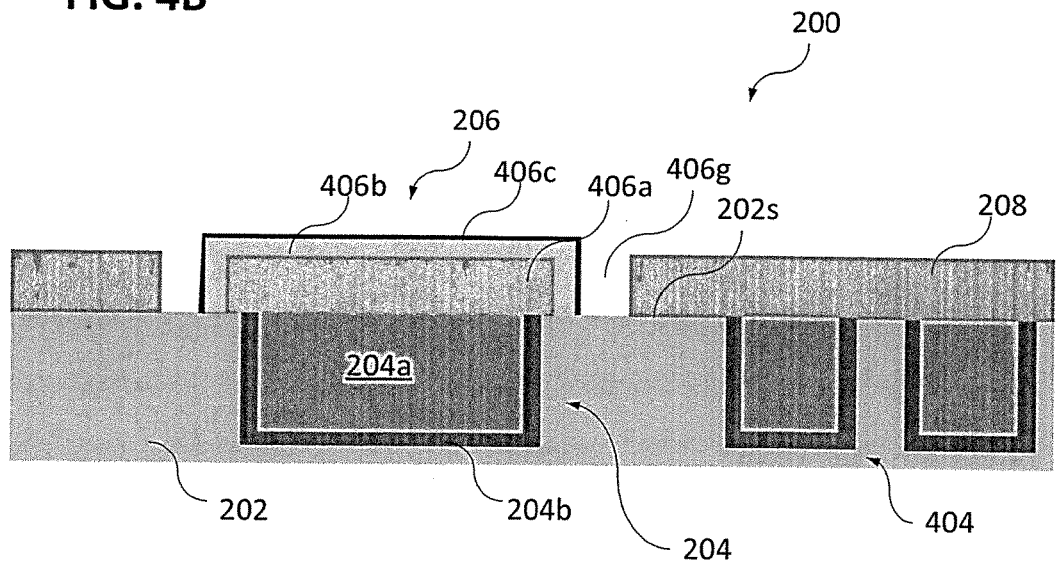
Figure 4C:
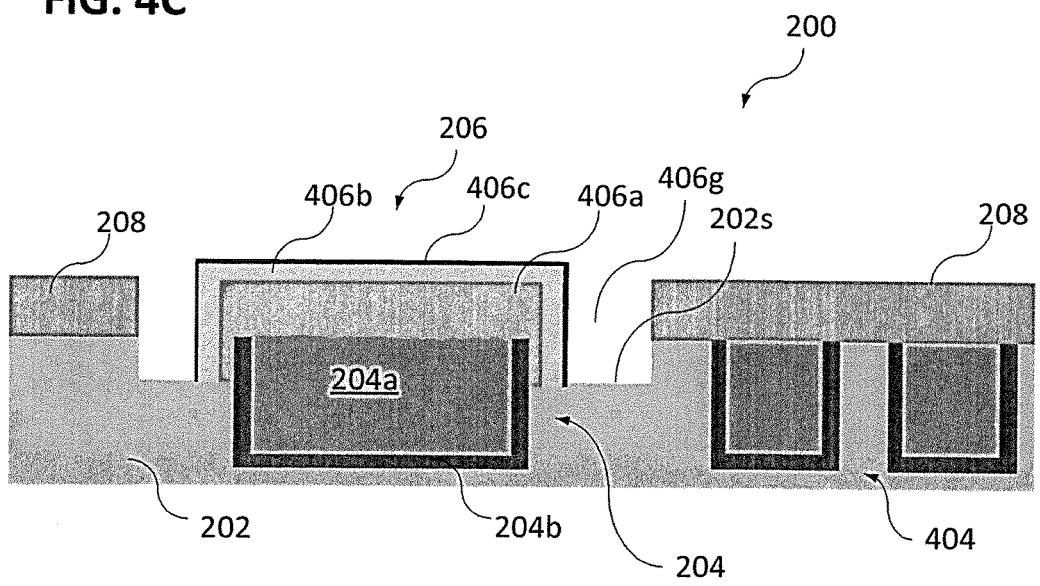
Figure 4D:
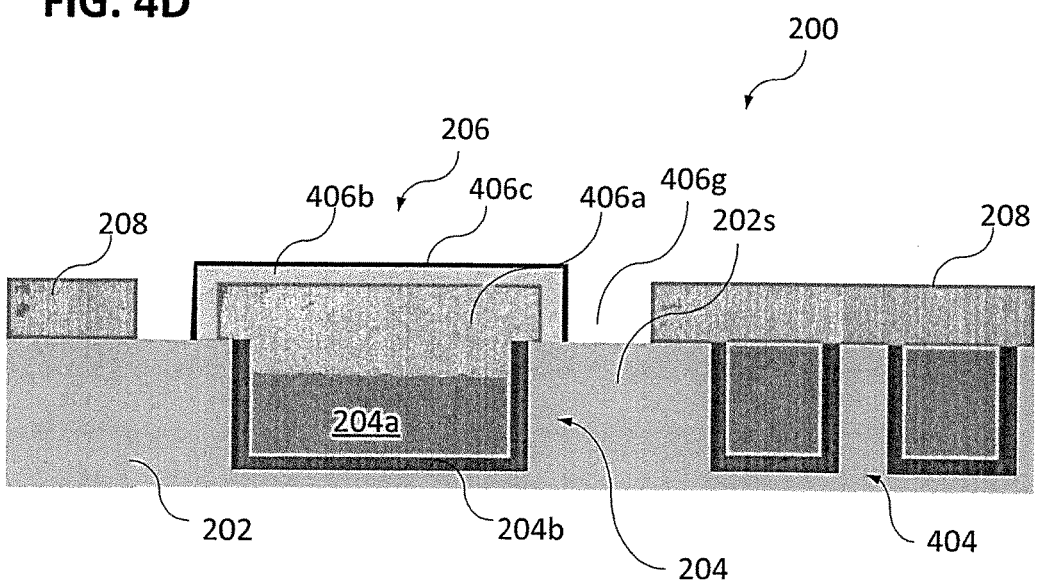

As shown in FIG. 4B, the contact pad structure 200 may be configured such that a gap 406g may be provided between the passivation layer 208 (e.g. the electrically insulating passivation layer structure 208) and the contact structure 206. In this case, the dielectric layer structure 202 may be configured as a passivation layer, since otherwise the passivation at the surface of the metallization structure may be open.

As shown in FIG. 4C, the dielectric layer structure 202 or the material of the dielectric layer structure 202 may be partially removed (etched) in one or more regions adjacent to the contact structure 206 and the contact pad 204. Therefore, the contact pad 204 may for example protrude from the dielectric layer structure 202, wherein the contact pad 204 may be partially surrounded by the contact structure 206. This may result in a more stable contact pad 204, since the quality of the interface between the electrically conductive material of the first contact structure region 406a (e.g. NiP), and the electrically conductive material of the liner structure 204b may be larger, which may reduce the diffusion of material of the metal structure 204a of the contact pad 204 to the outside of the contact pad 204. Illustratively, it was recognized that the interface between two electrically conductive materials may be less susceptible to material diffusion along the interface as an interface between an electrically conductive material and an electrically insulating material.

In analogy, as shown in FIG. 4D, the metal structure 204a of the contact pad 204 may be recessed such that a part of the liner structure 204b (e.g. at a sidewall of the liner structure 204b) may be free of the metal structure 204a of the contact pad 204, wherein the contact structure 206 may completely cover the metal structure 204a and the part of the liner structure 204b being free of the metal structure 204a. As already described, this may result in a more stable contact pad 204, since the high quality interface between the electrically conductive material of the first contact structure region 406a (e.g. NiP), and the electrically conductive material of the liner structure 204b (e.g. Ta) may be larger than an interface between the liner structure 204b and an electrically insulating material.

As shown in FIGS. 4C and 4D, a separation distance between the electrically conductive material of the metal structure 204a of the contact pad 204 and the gap or the passivation layer structure 208 may increase, which may increase the barrier for diffusion of a material from the metal structure 204a of the contact pad 204 or to the metal structure 204a of the contact pad 204.

Figure 4E:
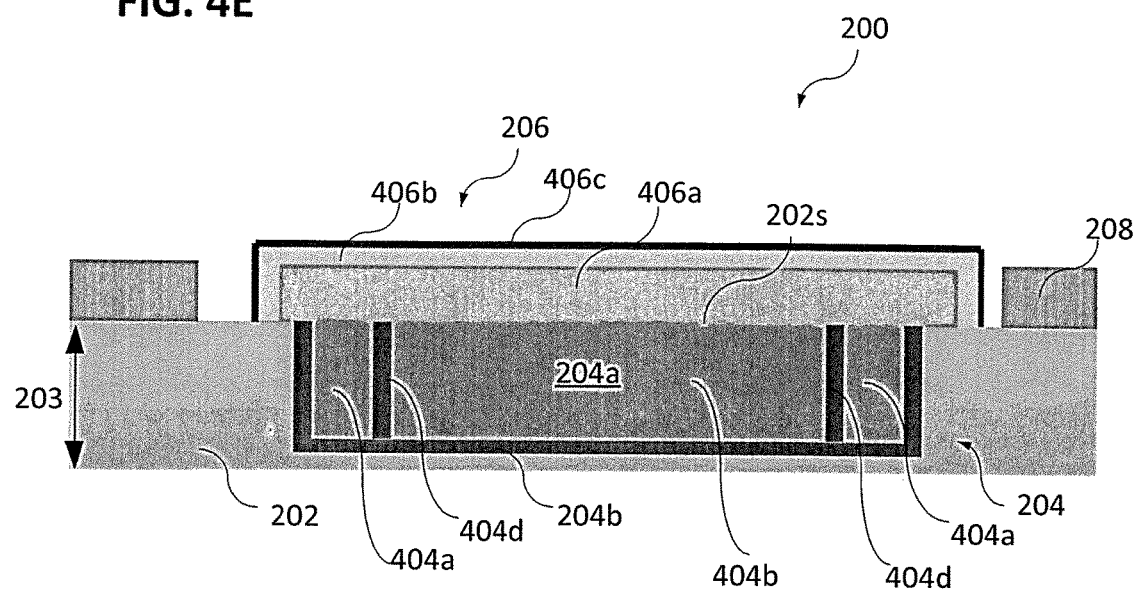

As shown in FIG. 4E, the metal structure 204a of the contact pad 204 may include a first metal structure region 404a and a second metal structure region 404b, wherein the first metal structure region 404a and the second metal structure region 404b may be separated or at least partially separated from each other by a diffusion bather structure 404d. Illustratively, the first metal structure region 404a may provide sacrifice material which may diffuse out of the contact pad 204, wherein due to the diffusion bather structure 404d the material in the second metal structure region 404b of the metal structure 204a of the contact pad 204 may be less susceptible to diffusion.

According to various embodiments, the diffusion bather structure 404d may include for example titanium, titanium nitride, tantalum, tantalum nitride, tungsten, a titanium/tungsten alloy, an oxide, a nitride, an oxynitride, a self-forming bather, and the like, and combinations thereof.

According to various embodiments, the diffusion bather structure 404d may include for example the same material as the dielectric layer structure 202. According to various embodiments, the first metal structure region 404a and the second metal structure region 404b may include the same material as described referring to the metal structure 204a of the contact pad 204. According to various embodiments, the second metal structure region 404b may completely surround (along the lateral direction) the first metal structure region 404a. In this case, the contact pad 204 may include at least one via being arranged below first metal structure region 404a, wherein the via may be electrically conductively connected to the first metal structure region 404a.

According to various embodiments, an electronic component may be provided; the electronic component may include a contact pad structure 200, as described before. FIG. 5A shows a first part of an electronic component 500 in a schematic cross sectional view, according to various embodiments. The first part of the electronic component 500 may include at least an integrated circuit structure 524 being arranged at least one of over and in a carrier 502. Further, the first part of the electronic component 500 may include a metallization structure 510 disposed over the integrated circuit structure 524, wherein the metallization structure 510 is electrically coupled to the integrated circuit structure 524. The first part of the electronic component 500 may include a dielectric layer structure 202 being disposed over the metallization structure 510. Further, the first part of the electronic component 500 may include at least one contact pad 204 being in physical contact with the dielectric layer structure 202 and being electrically coupled to the metallization structure 510; the at least one contact pad 204 may include a metal structure 204a and a liner structure 204b, wherein the liner structure 204b may be disposed between the metal structure 204a of the at least one contact pad 204 and the dielectric layer structure 202, and wherein a surface of the at least one contact pad 204 may be at least partially free from the liner structure 204b.

According to various embodiments, the dielectric layer structure 202 may be the last metallization layer of a multilevel metallization. Therefore, the dielectric layer structure 202 may be a part of the metallization structure 510. In other words, the metallization structure 510 may include a top layer including the dielectric layer structure 202 and the contact pad 204 being at least partially embedded into the dielectric layer structure 202, as described before.

According to various embodiments, the carrier 522 may include a semiconductor substrate, a wafer, or another type of carrier, as described before. The integrated circuit structure 524 may be arranged (formed) at least one of over and in the carrier 522, e.g. in any semiconductor technology. The integrated circuit structure 524 may include at least one of the following basic semiconductor structures: a MOS-structure (metal oxide semiconductor structure), an nMOS-structure (n-channel MOS-structure), a pMOS-structure (p-channel MOS-structure), a CMOS-structure (complementary metal oxide semiconductor structure). Further, according to various embodiments, the integrated circuit structure 524 may include or may be a part of (or may provide a part of) at least one of the following components: a chip, a memory chip, a die, a microprocessor, a microcontroller, a memory structure, a charge storage memory, a random access memory, a dynamic random access memory, a logic circuit, a sensor, a nanosensor, an integrated transceiver, a micro-mechanical device, a micro-electronic device, a nano-electronic device, an electrical circuit, a digital circuit, an analog circuit, and any other electronic device based on semiconductor technology, as for example a radio-frequency identification (RFID) chip and a chip card module.

Further, a memory structure (e.g. the memory structure included in the integrated circuit structure 524) may include at least one of the following: a volatile memory, a DRAM (dynamic random access memory) or a non-volatile memory, a PROM (programmable read only memory), an EPROM (erasable PROM), an EEPROM (electrically erasable PROM), a flash memory, a floating gate memory, a charge trapping memory, an MRAM (magnetoresistive random access memory), a CBRAM (conductive bridge random access memory), and a PCRAM (phase change random access memory).

The integrated circuit structure 524 may include at least one electronic component of the following group of electronic components: a resistor, a capacitor, an inductor, a transistor (for example, a field effect transistor (FET) (e.g. a metal oxide semiconductor field effect transistor (MOSFET), a fin field effect transistor (FinFET), or a floating gate transistor), a power transistor, a bipolar transistor, an insulated gate bipolar transistor (IGBT)), a test structure, and any other electronic component based on semiconductor technology.

According to various embodiments, the metallization structure 510 may include a single level metallization or a multilevel metallization in any semiconductor metallization technology, for example copper etch based technology and/or aluminum etch based technology. The metallization structure 510 may include more than one (e.g. two, three, four, five, six, seven, eight, nine, ten, eleven, twelve, or even more than twelve) metallization layers 510a, 510b. Further, a dielectric layer structure 202, as already described, may be disposed over the metallization layers 510a, 510b, e.g. as a last metal or a final metallization layer.

A metallization layer 510a, 510b of the metallization structure 510 may include a dielectric material, e.g. an ILD, as already described, and an electrically conductive wiring structure including for example at least one of the following: one or more metal lines 513, 515, one or more vias 512, 514, and one or more landing structures 513, 515 to electrically connect the respectively adjacent metallization layers or to electrically connect to the one or more contact pads 204 of the dielectric layer structure 202 being disposed over the metallization layers 510a, 510b.

The dielectric layer structure 202 may include a layer stack including for example silicon oxide, silicon nitride, and/or silicon oxynitride. Further, the dielectric layer structure 202 may include an etch stop layer 519, e.g. including silicon oxide, such that the material of the dielectric layer structure 202 may be etched selectively to the etch stop layer 519. According to various embodiments, a silicon nitride layer may be arranged between the metallization layers 510a, 510b or between one metallization layer 510b and the dielectric layer structure 202, wherein the nitride layer may be opened to electrically connect the metallization layers 510a, 510b and/or the wiring of the dielectric layer structure 202 with each other using vias.

According to various embodiments, the dielectric layer structure 202, the contact pad 204, the metal structure 204a, and/or the liner structure 204b may be configured as described before referring to the contact pad structure 200.

As illustrated in FIG. 5B, an electronic component 500 may further include a contact structure 206 including an electrically conductive material; the contact structure 206 completely covering at least the surface being at least partially free from the liner structure of the at least one contact pad 204, wherein the liner structure 204b and the contact structure 206 may form a diffusion bather for a material of the metal structure 204a of the at least one contact pad 204; and wherein the contact structure 206 may be electrically coupled to the integrated circuit structure 524 via the at least one contact pad 204 and the metallization structure 510.

Naturally, the electrical connection between the contact structure 206 and the integrated circuit structure 524 may be provided by the electrically conductive wiring structure included in the metallization structure 510. Further, the contact pad 204 may include a via, as shown in FIGS. 5A to 5C.

The contact pad 204 being included in the contact structure 206 of the electronic component 500 may be configured as described referring to the contact structure 206 of the contact pad structure 200. In other words, the contact pad structure 200 may be a second part of the electronic component 500. The contact pad structure 200 and/or the electronic component 500 may include a plurality of contact structures 206, e.g. the number of contact structures 206 may be the same as the number of contact pads 204 being embedded in the dielectric layer structure 202.

According to various embodiments, an electronic component 500 and/or a contact pad structure 200 may further include a bond wiring structure 540, e.g. a bond wire or a plurality of bond wires, being contacted to the contact structure 206. The bond wiring structure 540 may be electrically conductively connected to the integrated circuit structure 524 via the contact structure 206, the at least one contact pad 204, and the metallization structure 510. Illustratively, the bond wiring structure 540 may not form an interface of a sufficient mechanical, thermal, and/or chemical stability with the contact pad 204 itself, since the materials of the contact pad 204 and the bond wiring structure 540 may be incompatible to form a high quality interface (e.g. if the contact pad 204 may include copper and the bond wiring structure 540 may include gold). Therefore, the bond wiring structure 540 may be attached to the contact structure 206 such that the interface between the bond wiring structure 540 and the contact structure 206 may provide a sufficient high adhesion (e.g. if the contact structure 206 may include a palladium top surface layer and the bond wiring structure 540 may include gold).

According to various embodiments, the contact structure 206 may include a material or a layer stack being formed via an electroless deposition process, wherein the material or the layer stack may be formed over the contact pad 204 including at least one of copper and aluminum. Alternatively, the contact structure 206 may include a material or a layer stack being formed via a galvanic plating process, wherein the material or the layer stack may be formed over the contact pad 204 including at least one of copper and aluminum. Referring to this, the material or the layer stack may be in direct contact with the copper and/or aluminum of the contact pad 204.

According to various embodiments, the contact pad structure 200 and/or the electronic component 500, as described herein, may omit a weak interface between a metallic material of the contact pad 204 and a dielectric material of the dielectric layer structure 202 or the passivation layer structure 208 being disposed over the dielectric layer structure 202. Illustratively, the activation energy for a metal diffusion (and/or migration) from the contact pad 204 may be increased. For example, the contact pad structure 200 and/or the electronic component 500, as described herein, may omit a weak interface between copper of the contact pad 204 and the dielectric layer structure 202 or the passivation layer structure 208. Illustratively, the activation energy for copper diffusion (and/or migration) from the contact pad 204 may be increased.

According to various embodiments, as shown in FIG. 4D, the metal structure 204a (e.g. Cu and/or Al) may be recessed from the dielectric surrounding, such that for example a weak interface between the dielectric surrounding and the metal structure 204a may be omitted and/or such that the activation energy for metal migration from the metal structure 204a may be increased. The metal structure 204a may be recessed (e.g. with a depth from about 50 nm to about 600 nm) via an etch process, e.g. a copper etch process or an aluminium etch process.

According to various embodiments, the electroless deposited contact structure 206 may cover the liner 204b (e.g. including tantalum) and the metal structure 204a (e.g. including copper) to thereby close the migration path for the metal of the metal structure 204a.

According to various embodiments, as shown in FIG. 4C, the metal structure 204a may protrude from the dielectric surrounding. Further, the metal structure 204a (e.g. including copper) and the liner 204b (e.g. including Ta, TiW, TaN, Ta) may protrude from the dielectric surrounding 202, which may be formed by an over-etch process (e.g. plasma etching) and/or wet etching (e.g. including a fluorine-based etchant, e.g. DHF/BHF). Therefore the weak interface may be omitted as already described. Further, a contact structure 206 (e.g. including NiP) may be deposited (e.g. electroless plated) over the liner 204b and the metal 204a of the contact pad 204; thereby closing the metal migration path.

Further, a recrystallization process may be performed to recrystallize the material of the contact structure 206 (e.g. the NiP), which may for example cause a hardening of the contact structure 206 since the material of the contact structure 206 (e.g. the NiP), becomes compressive. The recrystallization process may include a hot step or a heat treatment, e.g. at a temperature of larger than about 350° C. for a duration of about a few minutes. Further, the dielectric layer structure 202 (the ILD 202) may include SiON and/or SiN such that the final passivation may be closed.

According to various embodiments, the contact pad structure 200 and/or the electronic component 500 may be configured, as described, such that the diffusion of oxygen and/or water into the metal structure 204a of the contact pad 204 may be reduced or prevented, e.g. such that the diffusion of oxygen and/or water into the metal structure 204a during processing of the contact pad structure 200 and/or the electronic component 500 or during the use of the electronic component 500 may be reduced or prevented.

According to various embodiments, the metal structure 204a of the contact pad 204 may be encapsulated by the contact structure 206 and the liner 204b.

According to various embodiments, the contact pad 204 may be segmented and/or may be divided into several parts via a diffusion bather structure (the diffusion bather structure may have for example a lateral extension of about 600 nm, e.g. formed in dual damascene technique). The diffusion bather structure within the contact pad 204 may be covered by the contact structure 206. The diffusion bather structure may protect the metal structure 204a of the contact pad 204 from being oxidized. The diffusion bather structure may include the same material as the liner structure 204b.

According to various embodiments, a contact pad structure may include: a dielectric layer structure; at least one contact pad being in physical contact with the dielectric layer structure; the at least one contact pad including a metal structure and a liner structure, wherein the liner structure is disposed between the metal structure of the at least one contact pad and the dielectric layer structure, and wherein a surface of the at least one contact pad is at least partially free from the liner structure, and a contact structure including an electrically conductive material; the contact structure completely covering at least the surface being at least partially free from the liner structure of the at least one contact pad, wherein the liner structure and the contact structure form a diffusion bather for a material of the metal structure of the at least one contact pad.

According to various embodiments, the contact pad structure may further include: an electrically insulating passivation layer disposed over the dielectric layer structure such that at least portion of the contact structure is free from the electrically insulating passivation layer.

According to various embodiments, the contact structure may be further configured to partially cover the liner structure.

According to various embodiments, the lateral extension of the contact structure may be equal or larger than the lateral extension of the contact pad.

According to various embodiments, the contact pad may include at least one material of the following group of materials: copper and aluminum.

According to various embodiments, the dielectric layer structure may include at least one material of the following group of materials: an oxide, a nitride, an oxynitride, silicon oxide, silicon nitride, silicon oxynitride, a low-k material, and an ultra-low-k material.

According to various embodiments, the liner structure may include at least one material of the following group of materials: a transition metal, a rare earth metal, titanium, tantalum, a silicide, a transition metal silicide, a self-forming barrier, a titanium/tungsten alloy, manganese, and an aluminium/copper alloy.

According to various embodiments, the contact structure may include a first region being in direct contact with the surface of the contact pad, the first region being configured as reinforcement region to increase the stability of the contact pad.

According to various embodiments, the contact structure may include a second region covering the first region of the contact structure, the second region being configured as a barrier region to protect the first region of the contact structure.

According to various embodiments, the contact structure may include a third region covering the second region of the contact structure, the third region being exposed to provide an exposed contact surface.

According to various embodiments, the first region of the contact structure may include at least one material of the following group of materials: an electroless deposited electrically conductive material, NiP (a compound including nickel and phosphorus), Ni, NiMoP (a compound including nickel, molybdenum and phosphorus).

According to various embodiments, the second region of the contact structure may include at least one material of the following group of materials: palladium and gold. According to various embodiments, the second region of the contact structure may include at least one of palladium and gold.

According to various embodiments, the third region of the contact structure may include gold and/or palladium, to electrically conductively connect an external gold based wiring structure and/or a copper based wiring structure. According to various embodiments, an external gold based wiring structure may be a bond wire including gold. According to various embodiments, the second and the third region of the contact structure may include gold, e.g. the second and the third region of the contact structure may be formed as a structural entity. According to various embodiments, the second and the third region of the contact structure may include palladium, e.g. the second and the third region of the contact structure may be formed as a structural entity. According to various embodiments, an external copper based wiring structure may be a bond wire including copper.

According to various embodiments, the third region of the contact structure may include silver, to electrically conductively connect an external silver based wiring structure. According to various embodiments, an external silver based wiring structure may be a bond wire including silver.

According to various embodiments, the contact structure may include at least a first region being in direct contact with the surface of the contact pad, and a second region disposed over the first region, the second region covering the first region completely.

According to various embodiments, the contact structure may include at least a first region being in direct contact with the surface of the contact pad, and a second region disposed over the first region, the second region covering the first region at least partially. According to various embodiments, the contact structure may include at least a first contact structure region being in direct contact with the surface of the contact pad, and a second contact structure region disposed over the first region, the second region covering the first region at least partially.

According to various embodiments, the first region of the contact structure may include NiP.

According to various embodiments, the second region of the contact structure may include palladium.

According to various embodiments, the contact structure may include a third region covering the second region of the contact structure, the third region including an electrically conductive material forming a contact surface of the contact structure.

According to various embodiments, the contact structure may include an electroless deposited material. According to various embodiments, the contact structure may include an electroless plated nickel. According to various embodiments, the contact structure may include an electroless plated nickel-phosphorous.

According to various embodiments, the contact structure may include an electroplated material. According to various embodiments, the contact structure may include an electroplated nickel. According to various embodiments, the contact structure may include an electro-plated nickel-phosphorous.

According to various embodiments, the electrically insulating passivation layer structure may include at least one material of the following group of materials: a dielectric material, an electrically insulating organic material, a polymer, imide, and amide. According to various embodiments, the electrically insulating passivation layer structure may include the same material or the same materials as the dielectric layer structure. According to various embodiments, the dielectric layer structure 202 may be a part of an interlayer dielectric, e.g. being covered with the electrically insulating passivation layer structure.

According to various embodiments, the contact pad may include a first region and a second region being laterally next to each other, wherein a diffusion barrier region is disposed between the first region of the contact pad and the second region of the contact pad. The diffusion bather region may be a part of the dielectric layer structure. Further, the diffusion bather region may be formed by providing the first contact pad region and the second contact pad region, wherein the first contact pad region may be arranged in a distance laterally next to the second contact pad region.

According to various embodiments, the contact pad may include a first contact pad region, a second contact pad region, and a diffusion barrier region, the first contact pad region and the second contact pad region may be arranged laterally next to each other, wherein the diffusion bather region may be disposed between the first contact pad region and the second contact pad region.

According to various embodiments, the second region of the contact pad may be configured as a sacrifice region laterally surrounding the first region of the contact pad such that the second region of the contact pad may be disintegrated faster due to a diffusion process than the first region of the contact pad.

According to various embodiments, a method for manufacturing a contact pad structure may include: providing a dielectric layer structure; providing at least one contact pad being in physical contact with the dielectric layer structure; the at least one contact pad including a metal and a liner structure, wherein the liner structure is disposed between the metal of the at least one contact pad and the dielectric layer structure, and wherein an upper surface of the at least one contact pad is at least partially free of the liner structure, providing a contact structure including an electrically conductive material disposed over the at least one contact pad, wherein the contact structure is covering at least the upper surface of the at least one contact pad completely, wherein the liner structure and the contact structure are configured to provide a diffusion bather for the metal of the contact pad.

According to various embodiments, providing a contact structure may include forming one or more contact structure layers via an electroless deposition process.

According to various embodiments, an electronic component may include: an integrated circuit structure arranged at least one of over and in a carrier; a metallization structure disposed over the integrated circuit structure, wherein the metallization structure is electrically coupled to the integrated circuit structure; a dielectric layer structure disposed over the metallization structure; at least one contact pad being in physical contact with the dielectric layer structure and being electrically coupled to the metallization structure; the at least one contact pad including a metal structure and a liner structure, wherein the liner structure is disposed between the metal structure of the at least one contact pad and the dielectric layer structure, and wherein a surface of the at least one contact pad is at least partially free from the liner structure, and a contact structure including an electrically conductive material; the contact structure completely covering at least the surface being at least partially free from the liner structure of the at least one contact pad, wherein the liner structure and the contact structure form a diffusion bather for a material of the metal structure of the at least one contact pad; and wherein the contact structure is electrically coupled to the integrated circuit structure via the at least one contact pad and the metallization structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A contact pad structure comprising:
a dielectric layer structure;
at least one contact pad in physical contact with the dielectric layer structure, the at least one contact pad comprising a metal structure and a liner structure, wherein the liner structure is disposed between the metal structure of the at least one contact pad and the dielectric layer structure, and wherein an upper surface of the metal structure is at least partially free from the liner structure, wherein the at least one contact pad comprises an upper portion that protrudes from the dielectric layer structure, the upper portion including the upper surface of the metal structure and an upper portion of the liner structure; and
a contact structure comprising an electrically conductive material; the contact structure surrounding the upper portion of the at least one contact pad protruding from the dielectric layer structure so as to completely cover at least the upper surface of the metal structure being at least partially free from the liner structure of the at least one contact pad and cover the upper portion of the liner structure,
wherein the liner structure and the contact structure form a diffusion barrier for a material of the metal structure of the at least one contact pad, and
wherein a lateral extension of the contact structure is larger than a lateral extension of the contact pad.

2. The contact pad structure according to claim 1, further comprising:
an electrically insulating passivation layer structure disposed over the dielectric layer structure such that at least portion of the contact structure is free from the electrically insulating passivation layer structure.

3. The contact pad structure according to claim 1;
wherein the contact structure is further configured to partially cover the liner structure.

4. The contact pad structure according to claim 1;
wherein the contact pad comprises at least one material of the following group of materials, the group comprising: copper and aluminum.

5. The contact pad structure according to claim 1;
wherein the dielectric layer structure comprises at least one material of the following group of materials, the group comprising: an oxide, a nitride, an oxynitride, silicon oxide, silicon nitride, silicon oxynitride, a low-k material, an ultra-low-k material.

6. The contact pad structure according to claim 1;
wherein the liner structure comprises at least one material of the following group of materials, the group comprising: a transition metal, a rare earth metal, titanium, a titanium based alloy, tantalum, a titanium/tantalum alloy, a titanium/tungsten alloy, a silicide, a transition metal silicide.

7. The contact pad structure according to claim 1, wherein the contact structure comprises:
a first contact structure region completely covering the upper surface of the metal structure and completely covering a top surface of the liner structure facing toward the contact structure,
a second contact structure region completely covering a top surface of the first contact structure region facing away from the dielectric layer structure and completely covering sidewalls of the first contact structure region, and
a third contact structure region completely covering a top surface of the second contact structure region facing away from the dielectric layer structure and completely covering sidewalls of the second contact structure region, wherein the first, second, and third contact structure regions are different materials.

8. The contact pad structure according to claim 7;
wherein the first contact structure region is in direct contact with the upper surface of the contact pad.

9. The contact pad structure according to claim 8;
wherein the first contact structure region comprises at least one material of the following group of materials, the group comprising: an electroless deposited electrically conductive material, Ni, NiP, NiMoP.

10. The contact pad structure according to claim 9;
wherein the second contact structure region comprises at least one material of the following group of materials, the group comprising: palladium and gold.

11. The contact pad structure according to claim 8;
wherein the third contact structure region comprises an electrically conductive material forming a contact surface of the contact structure.

12. The contact pad structure according to claim 11;
wherein the third contact structure region comprises at least one of gold and palladium, to electrically conductively connect an external gold based wiring structure.

13. The contact pad structure according to claim 1;
wherein the contact structure comprises an electroless deposited material.

14. The contact pad structure according to claim 2;
wherein the electrically insulating passivation layer structure comprises at least one material of the following group of materials, the group comprising: a dielectric material, an electrically insulating organic material, a polymer, imide, amide.

15. The contact pad structure according to claim 1,
wherein the metal structure of the contact pad comprises at least a first metal structure, a second metal structure arranged laterally next to the first metal structure, and a diffusion barrier region,
wherein the diffusion barrier region is disposed between the first metal structure and the second metal structure of the contact pad.

16. The contact pad structure according to claim 15;
wherein the first metal structure comprises a first material and the second region comprises the same material as the first metal structure.

17. The contact pad structure according to claim 16;
wherein the second metal structure of the contact pad is laterally surrounding the first metal structure of the contact pad such that the material of the second metal structure is diffusing faster out of the contact pad than the material of the first metal structure.

18. The contact pad structure of claim 1, wherein a top surface of the first contact structure region facing away from the contact pad is exposed.

19. The contact pad structure of claim 1, wherein the first contact structure region comprises a nickel-phosphorous alloy, the second contact structure region comprises palladium, and the third contact structure region comprises gold.

20. A method for manufacturing a contact pad structure, the method comprising:
providing a dielectric layer structure;
providing at least one contact pad being in physical contact with the dielectric layer structure the at least one contact pad comprising a metal structure and a liner structure, wherein the liner structure is disposed between the metal structure of the at least one contact pad and the dielectric layer structure, and wherein an upper surface of the metal structure is at least partially free from the liner structure, wherein the at least one contact pad comprises an upper portion that protrudes from the dielectric layer structure, the upper portion including the upper surface of the metal structure and an upper portion of the liner structure; and providing a contact structure comprising an electrically conductive material; the contact structure surrounding the upper portion of the at least one contact pad protruding from the dielectric layer structure so as to completely cover at least the upper surface of the metal structure being at least partially free from the liner structure of the at least one contact pad and cover the upper portion of the liner structure.

21. The method according to claim 20;
wherein providing a contact structure comprises forming one or more contact structure layers via an electroless deposition process.

22. An electronic component comprising:
an integrated circuit structure arranged at least one of over and in a carrier;
a metallization structure disposed over the integrated circuit structure, wherein the metallization structure is electrically coupled to the integrated circuit structure;
a dielectric layer structure disposed over the metallization structure;
at least one contact pad being in physical contact with the dielectric layer structure and being electrically coupled to the metallization structure the at least one contact pad comprising a metal structure and a liner structure, wherein the liner structure is disposed between the metal structure of the at least one contact pad and the dielectric layer structure, and wherein an upper surface of the metal structure is at least partially free from the liner structure, wherein the at least one contact pad comprises an upper portion that protrudes from the dielectric layer structure, the upper portion including the upper surface of the metal structure and an upper portion of the liner structure, and
a contact structure comprising an electrically conductive material; the contact structure surrounding the upper portion of the at least one contact pad protruding from the dielectric layer structure so as to completely cover at least the upper surface of the metal structure being at least partially free from the liner structure of the at least one contact pad and cover the upper portion of the liner structure wherein the liner structure and the contact structure form a diffusion barrier for a material of the metal structure of the at least one contact pad; and wherein the contact structure is electrically coupled to the integrated circuit structure via the at least one contact pad and the metallization structure.

23. A contact pad structure comprising:
a dielectric layer structure;
at least one contact pad vertically above and in physical contact with the dielectric layer structure, the at least one contact pad comprising a metal structure and a liner structure, wherein the liner structure is disposed between the metal structure of the at least one contact pad and the dielectric layer structure, and wherein an upper surface of the metal structure is at least partially free from the liner structure; and a contact structure comprising an electrically conductive material; the contact structure completely covering at least the upper surface being at least partially free from the liner structure of the at least one contact pad, wherein the liner structure and the contact structure form a diffusion barrier for a material of the metal structure of the at least one contact pad, and wherein a lateral extension of the contact structure is larger than a lateral extension of the contact pad, wherein the metal structure of the contact pad comprises at least a first metal structure, a second metal structure arranged laterally next to the first metal structure, and a diffusion barrier region, wherein the diffusion barrier region is disposed between the first metal structure and the metal structure of the contact pad.

24. The contact pad structure of claim 23, wherein the first metal structure and the second metal structure comprise a same material.

25. The contact pad structure of claim 23, wherein the second metal structure of the contact pad laterally surrounding the first metal structure of the contact pad with top surfaces and bottom surfaces of the first and second metal structure being co-planar.

26. The contact pad structure of claim 25, wherein a material of the second metal structure diffuses faster out of the contact pad than the material of the first metal structure.

* * * * *